(12) United States Patent
Zhu et al.

(10) Patent No.: US 7,813,162 B2
(45) Date of Patent: Oct. 12, 2010

(54) SRAM CELL HAVING ASYMMETRIC PASS GATES

(75) Inventors: Huilong Zhu, Poughkeepsie, NY (US); Qingqing Liang, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 220 days.

(21) Appl. No.: 12/038,985

(22) Filed: Feb. 28, 2008

(65) Prior Publication Data

US 2009/0218631 A1    Sep. 3, 2009

(51) Int. Cl.
G11C 11/00 (2006.01)
G11C 5/06 (2006.01)
(52) U.S. Cl. .............................. 365/154; 365/63; 365/72
(58) Field of Classification Search ................. 365/154, 365/155, 156, 63, 72
See application file for complete search history.

(56) References Cited

U.S. PATENT DOCUMENTS 6,466,489 B1 * 10/2002 Ieong et al. ............ 365/189.09
2007/0076468 A1 * 4/2007 Schoellkopf ................. 365/154
2008/0175039 A1 * 7/2008 Thomas et al. ............... 365/154
2009/0014798 A1 * 1/2009 Zhu et al. .................... 257/351
2009/0073758 A1 * 3/2009 Freeman et al. ............. 365/174
2009/0185409 A1 * 7/2009 Bansal et al. ................ 365/154

* cited by examiner

*Primary Examiner*—Ly D Pham
(74) *Attorney, Agent, or Firm*—Scully, Scott, Murphy & Presser, P.C.; H. Daniel Schnurmann

(57) ABSTRACT

Conductive stripes laterally abutting the dielectric lines are formed over a thin semiconductor layer on a gate dielectric. Angled halo ion implantation is performed to implant p-type dopants on the side of the drains of pull-down transistors and a first source/drain region of each pass gate transistor. The dielectric lines are removed and the pattern of the conductive stripes is transferred into the semiconductor layer to form gate electrodes. The resulting pass gate transistors are asymmetric transistors have a halo implantation on the side of the first source/drain regions, while the side of a second source/drain regions does not have such a halo implantation. As such, the pass gate transistors provide enhanced readability, writability, and stability.

16 Claims, 25 Drawing Sheets

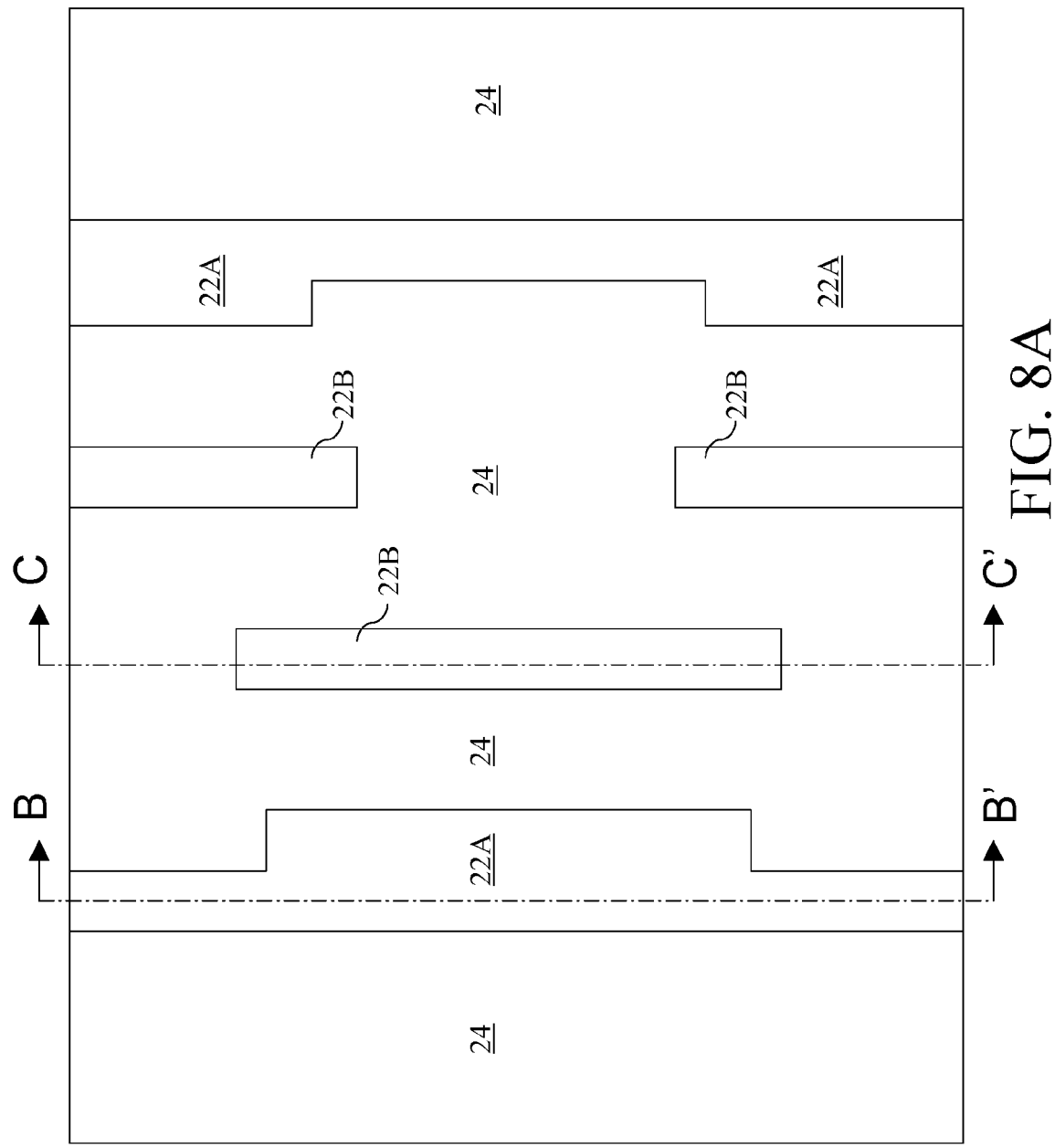

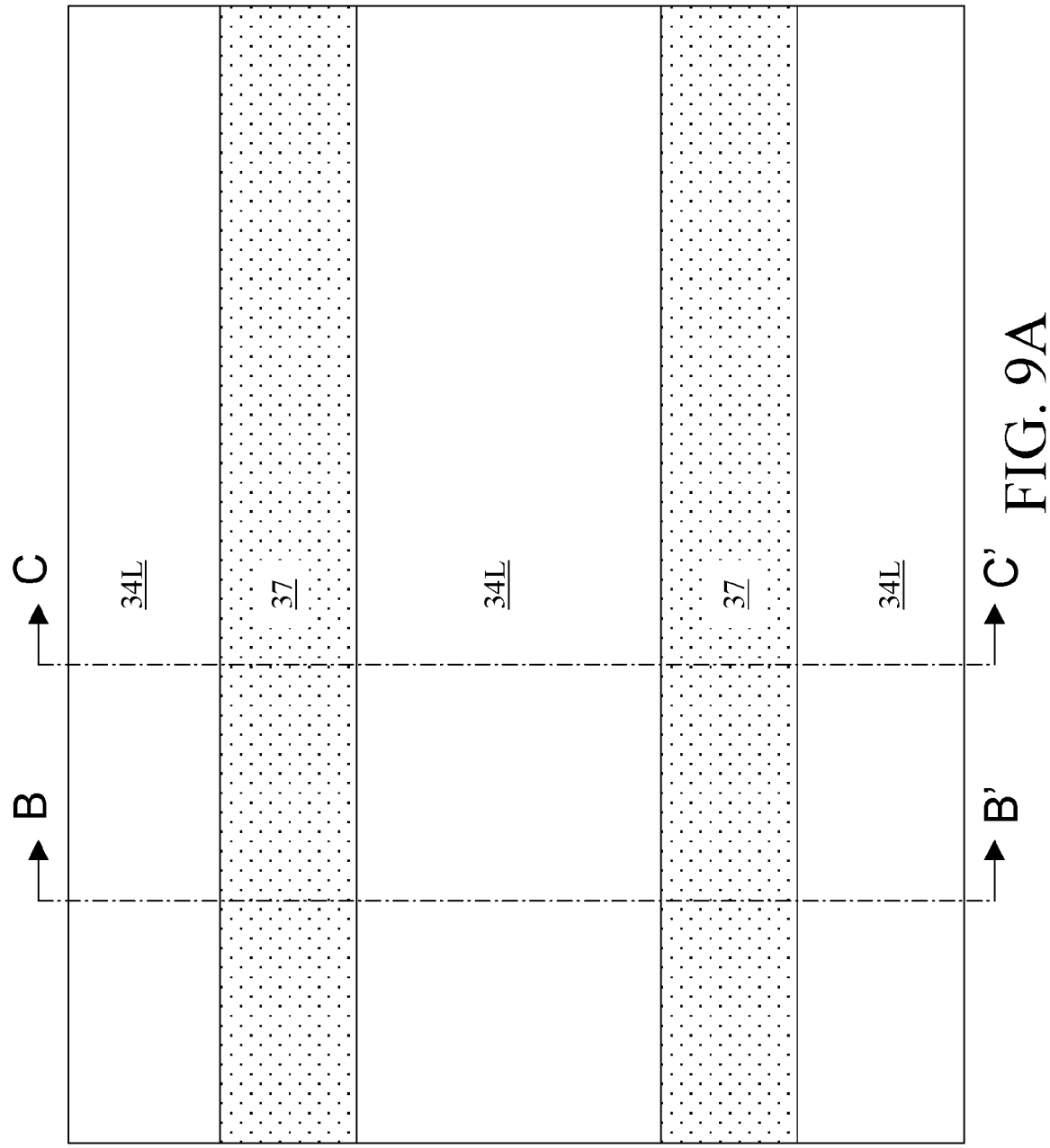

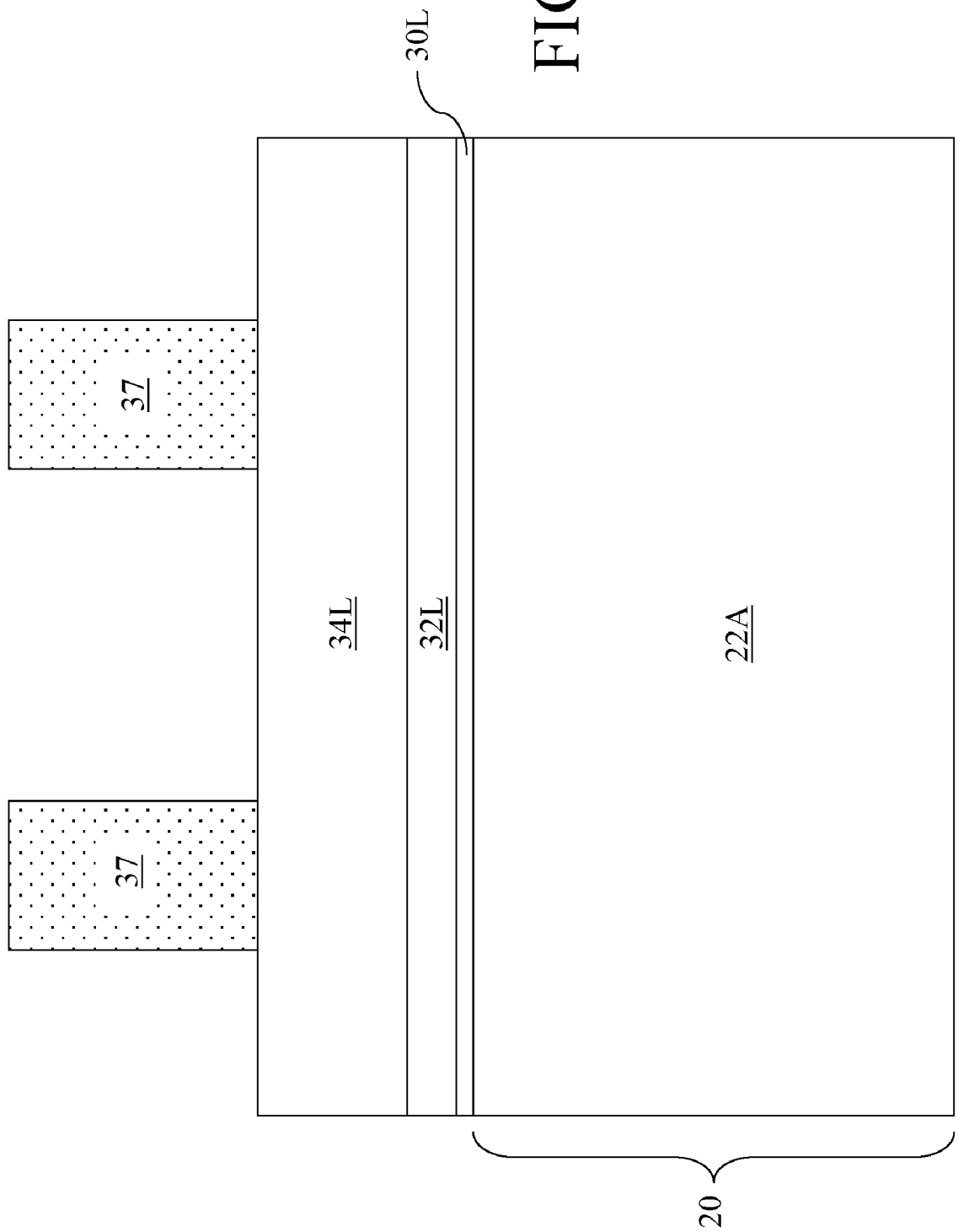

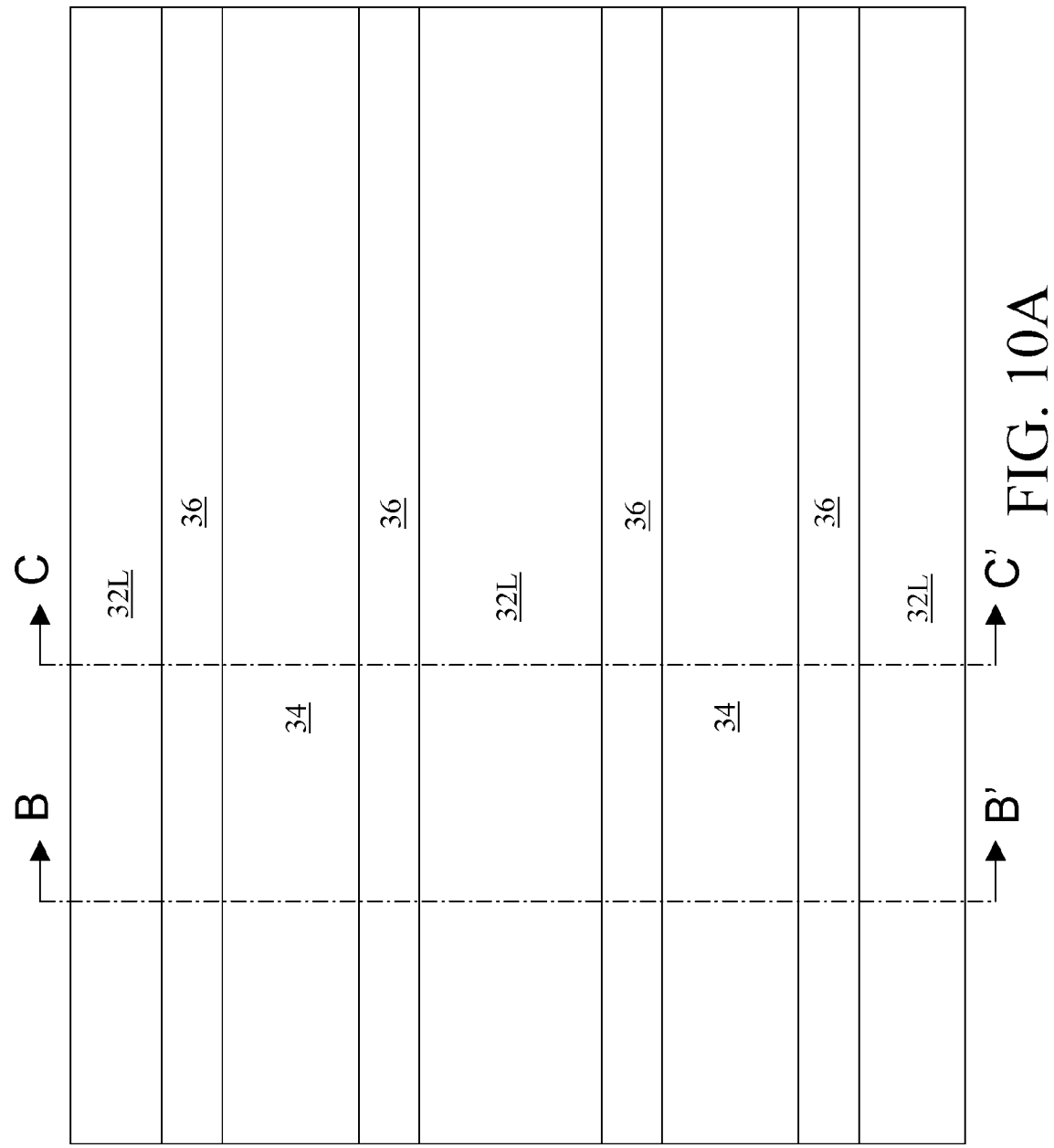

US 7,813,162 B2

SRAM CELL HAVING ASYMMETRIC PASS GATES

FIELD OF THE INVENTION

The present invention relates to semiconductor structures, and particularly to a static random access memory (SRAM) cell structure having a pair of asymmetric pass gate, an SRAM circuit comprising a pair of asymmetric pass gate, and methods of manufacturing the SRAM cell structure.

BACKGROUND OF THE INVENTION

Conventional complementary metal-oxide-semiconductor (CMOS) devices offer higher on-current for n-type field effect transistors (NFETs) than for p-type field effect transistors (PFETs) having similar physical dimensions. This is, in general, due to higher electron mobility than hole mobility in most semiconductor materials. In the case of a silicon substrate having a (100) surface, the ratio of electron mobility to hole mobility is about 2. Correspondingly, semiconductor circuits have been designed to factor in the differences in the on-current per unit width of NFETs and PFETs.

Static random access memory (SRAM) is a memory device employing six transistors. SRAM cell design typically begins by picking the smallest PFET supported by a given technology for two pull-up PFETs, followed by scaling of NFET pass gate transistors and pull-down NFET transistors for optimal beta ratio, cell stability, and access time.

Referring to FIGS. 1A-1C, an exemplary prior art SRAM cell structure comprises a first planar pull-up PFET 116, a second planar pull-up PFET 116', two planar pull-down NFETs (114, 114'), and two planar pass gate NFETs (112, 112'). FIG. 1A is a top-down view of a layout for the exemplary SRAM cell up to the contact-to-active area (CA) level not showing a middle-of-line (MOL) dielectric 170. FIG. 1B is a vertical cross-sectional view of the exemplary SRAM cell along the plane B-B' showing the MOL dielectric 170. FIG. 1C is a vertical cross-sectional view of the exemplary SRAM cell along the plane C-C' showing the MOL dielectric 170. Each of the transistors (112, 112', 114, 114', 116, 116') comprises a portion of the semiconductor substrate 110, a portion of a gate dielectric 130, a portion of gate electrodes 132, portions of gate spacers 134, portions of active area (AA) silicides 160, and a portion of gate top silicides 164.

The gate dielectric 130 may comprise a conventional semiconductor oxide based dielectric material such as silicon oxide or silicon nitride. Alternately, the gate dielectric 130 may comprise a high dielectric constant (high-k) material having a dielectric constant greater than 4.0, and typically greater than 7.0. The gate electrodes 132 may comprise a doped polycrystalline semiconductor material such as doped polysilicon. Alternately, the gate electrodes 132 may comprise a metal gate material known in the art.

A shallow trench isolation structure 120 physically separates the transistors (112, 112', 114, 114', 116, 116') and provides electrical isolation among the transistors (112, 112', 114, 114', 116, 116'). CA contact vias 176 and CA bars 178 are employed to provide electrical wiring among the transistors (112, 112', 114, 114', 116, 116'). One of the CA bars 178, which contacts one of the active area (AA) silicides 160 of the first planar pull-up PFET 116 as well as the gate top silicides 164 of the second planar pull-up PFET 116' as shown in FIG. 1B, provides electrical connection between the drain of the first planar pull-up PFET 116 and the gate of the second planar pull-up PFET 116'. Likewise, another CA bar 178 provides electrical connection between the drain of the second planar pull-up PFET 116' and the gate of the first planar pull-up PFET 116.

Each of the active areas for the planar pass gate NFETs (112, 112') has a first width W1, and each of the active areas for the planar pull-down NFETs (114, 114') has a second width W2. A beta ratio, which is the ratio of an on-current of each of the planar pull-down NFETs (114, 114') to an on-current of each of the planar pass gate NFETs (112, 112'), is substantially the same as the ratio of the second width W2 to the first width W1. Typically, the planar pass gate NFETs (112, 112') and the planar pull-down NFETs (114, 114') have the same threshold voltage. It has been shown that the beta ratio needs to be close to 2.0 for optimal cell stability of an SRAM cell. Thus, the ratio of the second width W2 to the first width W1 is close to 2.0 in the exemplary prior art SRAM cell.

Referring to FIG. 2, a circuit schematic 118 for the exemplary prior art SRAM cell shows a first pair of a first pass gate n-type field effect transistor (NFET) 102 and a first pull-down n-type field effect transistor (NFET) 104. A first source/drain of the first pass gate NFET 102 and a first drain of the first pull down NFET 104 are adjoined to form an electrical connection at a first internal node 111. In the physical structure, this electrical connection is achieved by a first active area that contains both the first source/drain of the first pass gate NFET 102 and the first drain of the first pull-down NFET 104. Similarly, a second source/drain of the second pass gate NFET 102' and a second drain of a second pull-down NFET 104' are adjoined to form another electrical connection at a second internal node 111'. In the physical structure, this electrical connection is achieved by a second active area that contains both the second source/drain of the second pass gate NFET 102' and the second drain of the second pull-down NFET 104'. The circuit schematic 118 further comprises a first pull-up p-type field effect transistor (PFET) 106 containing a third drain, which is physically a third active area, and a second pull-up PFET 106' containing a fourth drain, which is physically a fourth active area. Each of the source/drain nodes of the pass gate transistors (102, 102') may function as a source or a drain depending on the operation of the SRAM circuit. The sources of the first and second pull-up PFETs (106, 106') are connected to a circuit supply voltage $V_{CS}$ through a power supply wiring 119. The sources of the first and second pull-down NFETs (104, 104') are connected to ground.

The third active area is electrically connected to the first active area via a collection of a first contact via, a first M1 wire, and a first CA bar. This connection is represented in the circuit schematic 118 by the first internal node 111. Similarly, the fourth active area is electrically connected to the second active area via a collection of a second contact via, a second M1 wire, and a second CA bar. This connection is represented in the circuit schematic 118 by the second internal node 111'. The gates of the second pull-up PFET 106' and the second pull-down NFET 104' are adjoined to the third drain of the first pull-up PFET 106 via the first CA bar. This connection is represented in the circuit schematic 118 by a third internal node 113A and a fourth internal node 113B. The gates of the first pull-up PFET 106 and the first pull-down NFET 104 are adjoined to the fourth drain of the second pull-up PFET 106' via the first CA bar. This connection is represented in the circuit schematic 118 by a fifth internal node 113A' and a sixth internal node 113B'. The internal nodes (111, 111', 113A, 113B, 113A', 113B') are connected by CA contact vias 176 and CA bars 178 as well as M1 wires (not shown). Typically, the first internal node 111 is connected to the third internal node 113A at M1 level. Likewise, the second internal node 111' is connected to the fifth internal node 113A' at M1 level. The connection between the third internal node 113A and the fourth internal node 113B is effected by one of the CA bars 178. Likewise, the connection between the fifth internal node 113A' and the sixth internal node 113B' is effected by another of the CA bars 178. The M1 level wiring is also used for routing of the word lines (117, 117'). The M2 level wiring is used for routing of the bit lines (115, 115'). M3 and M4 levels (not shown) are used for a power supply voltage network and a ground network.

In general, three functionality aspects that are critical to functional yields of an SRAM cell include writability, readability, and stability. Writability refers to the ease, noise immunity, and reproducibility of write operations on the SRAM cell. Readability refers to the ease, noise immunity, and reproducibility of read operations of the SRAM cell. Stability refers to noise immunity of the data stored in the SRAM cell. Typically, enhancement of one of the three functional characteristics accompanies degradation of at least one of the other two functional characteristics.

In view of the above, there exists a need for an SRAM cell structure providing enhancement of at least one of writability, readability, and stability of an SRAM cell without degrading any of the other functional characteristics. Particularly, there exists a need for an SRAM cell structure providing simultaneous enhancement of all three functional characteristics, i.e., writability, readability, and stability of the SRAM cell. Further, there exist a need for an improved SRAM circuit achieving such functional enhancements, and methods of manufacturing the SRAM cell structure providing such functional advantages.

SUMMARY OF THE INVENTION

The present invention addresses the needs described above by providing a static random access memory (SRAM) cell structure having a pair of asymmetric pass gate transistors, an SRAM circuit containing a pair of such asymmetric pass gate transistors, and methods of manufacturing the SRAM cell having such a pair of asymmetric pass gate transistors.

In the present invention, a thin semiconductor layer is formed over a gate dielectric, followed by deposition and lithographic patterning of a dielectric layer as parallel stripes of dielectric lines. The dielectric lines cover portions of a semiconductor substrate in which drains of pull-down transistors and a first source/drain region of each pass gate transistor are to be formed. Conductive stripes laterally abutting the dielectric lines are formed over the areas of gate electrodes. Angled halo ion implantation is performed to implant p-type dopants on the side of the drains of pull-down transistors and the first source/drain region of each pass gate transistor. The dielectric lines are removed and the pattern of the conductive stripes is transferred into the semiconductor layer to form gate electrodes. The resulting pass gate transistors are asymmetric transistors have a halo implantation on the side of the first source/drain regions, while the side of a second source/drain regions does not have such a halo implantation. As such, the pass gate transistors provide enhanced readability, writability, and stability.

According to an embodiment of the present invention, a static random access memory (SRAM) cell structure is provided, which comprises:

a pair of pull-up p-type field effect transistors (PFETs);

a pair of pull-down n-type field effect transistors (NFETs), each pull-down NFET comprises a pull-down NFET drain region electrically connected to a pull-up PFET drain region of one of the pull-up PFETs; and a pair of pass gate transistors, wherein each pass gate transistor is an n-type field effect transistor comprising a first source/drain region, a pass gate halo region abutting the first source/drain region, a body region abutting the pass gate halo region, and a second source/drain region abutting the body region and disjoined from the pass gate halo region, wherein the pass gate halo region and the body region have a p-type doping, wherein the pass gate halo region has a higher dopant concentration than the body region.

According to another aspect of the present invention, a static random access memory (SRAM) circuit is provided, which comprises:

a pair of pull-up p-type field effect transistors (PFETs);

a pair of pull-down n-type field effect transistors (NFETs), each pull-down NFET comprises a pull-down NFET drain directly connected to a pull-up PFET drain of one of the pull-up PFETs; and a pair of pass gate transistors, wherein each pass gate transistor is an n-type field effect transistor comprising a first source/drain terminal and a second source/drain terminal, wherein each of the pair of pass gate transistors provides a greater on-current when the first source/drain terminal operates as a source and the second source/drain terminal operates as a drain than when the first source/drain terminal operates as a drain and the second source/drain terminal operates as a source.

According to yet another aspect of the present invention, a method of forming a semiconductor structure is provided, which comprises:

forming a dielectric line over a gate dielectric on a semiconductor substrate;

forming conductive stripes on sidewalls of the dielectric line;

forming halo implantation regions in the semiconductor substrate by angled ion implantation employing the dielectric line and the conductive stripes as an implantation mask; and forming at least two field effect transistors including the halo implantation regions, wherein each of the at least two field effect transistors has a first source/drain region that abut one of the halo implantation regions and a second source/drain region that is disjoined from the halo implantation regions.

BRIEF DESCRIPTION OF THE DRAWINGS

FIG. 1A is a top down view in which a middle-of-line (MOL) dielectric 170 is not shown. FIG. 1B is a vertical cross-sectional view of the exemplary prior art SRAM structure along the plane B-B' showing the MOL dielectric 170. FIG. 1C is a vertical cross-sectional views of the exemplary prior art SRAM structure along the plane C-C' showing the MOL dielectric 170.

DETAILED DESCRIPTION OF THE INVENTION

Figure 1A:
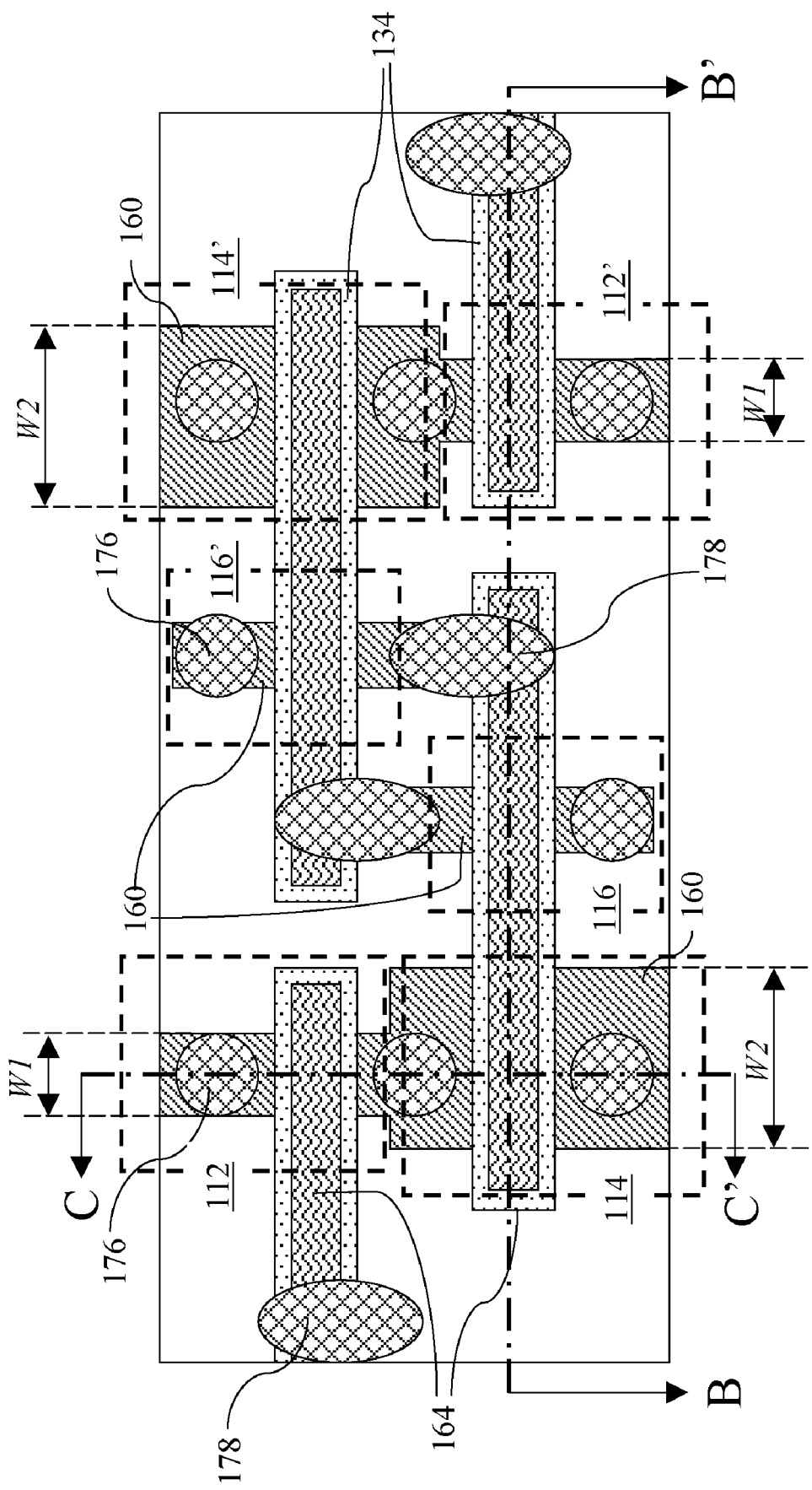
FIGS. 1A-1C show an exemplary prior art SRAM structure.
Figure 1B:
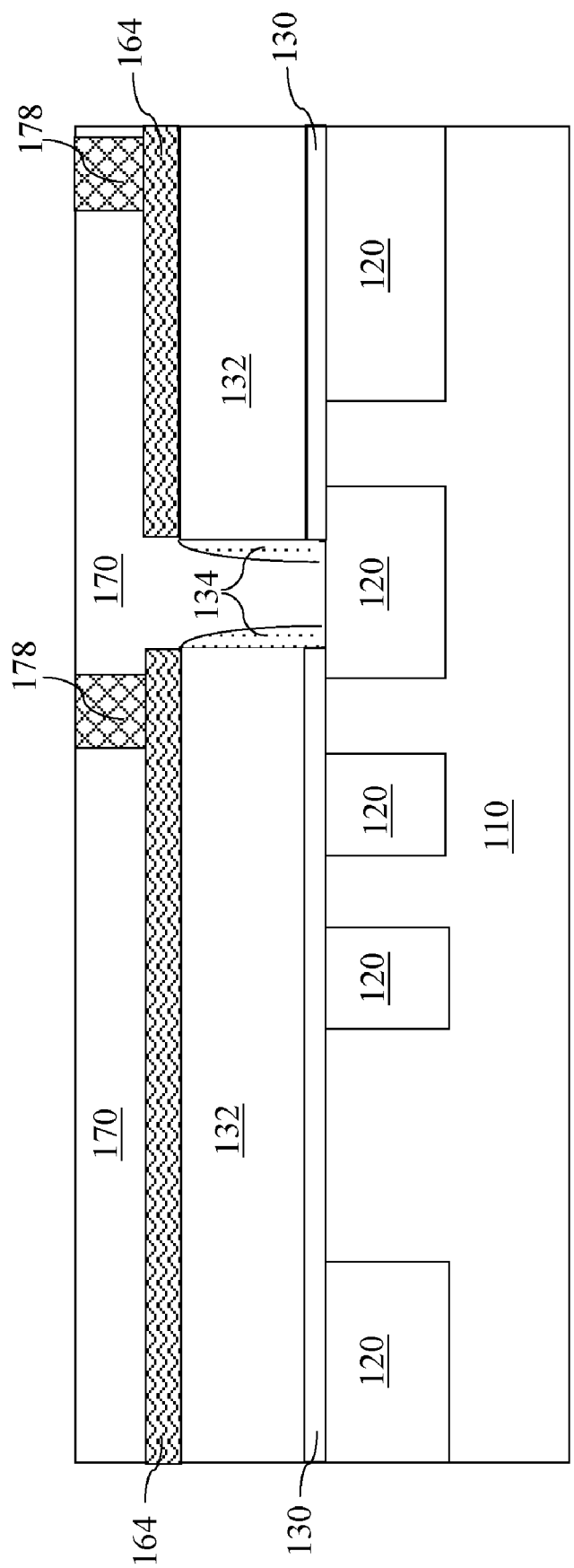
Figure 1C:
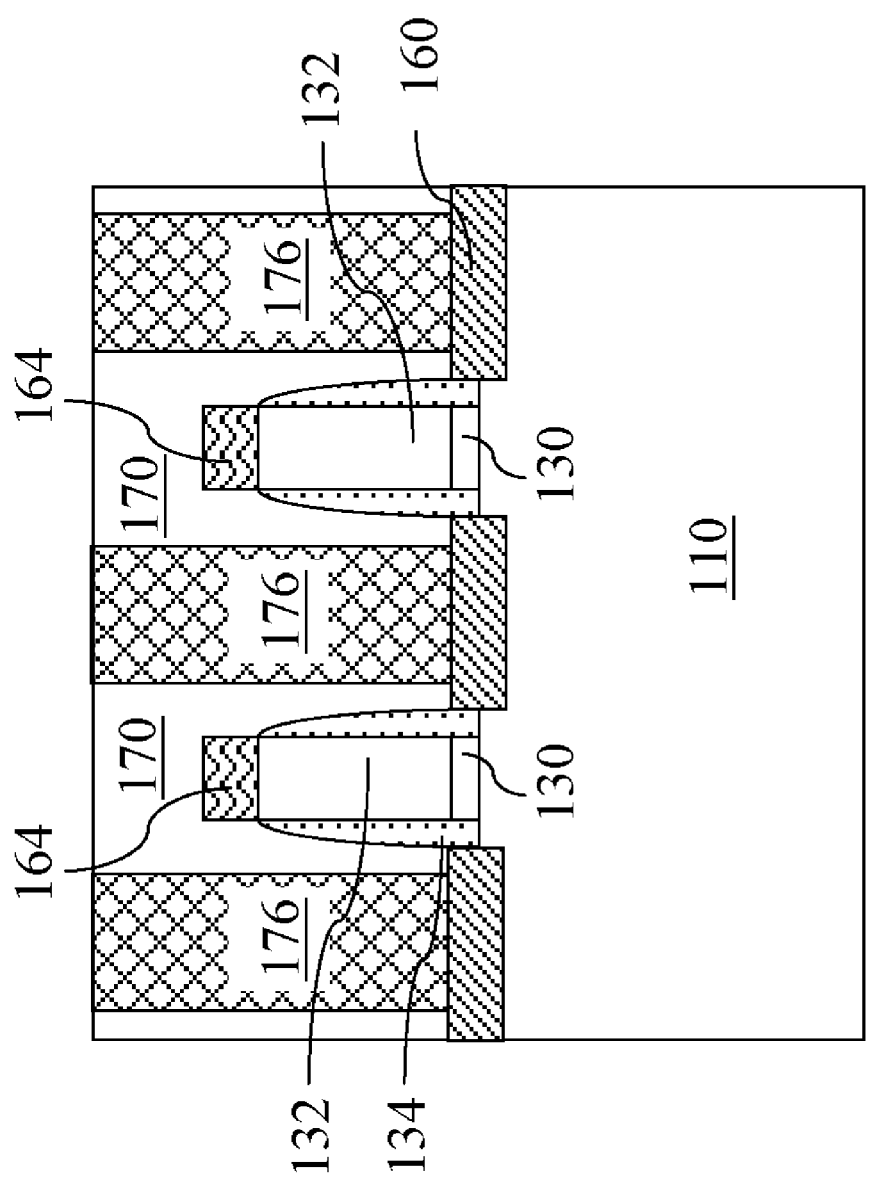

As stated above, the present invention relates to a static random access memory (SRAM) cell structure having a pair of asymmetric pass gate, an SRAM circuit comprising a pair of asymmetric pass gate, and methods of manufacturing the SRAM cell structure, which are now described in detail with accompanying figures. It is noted that like and corresponding elements mentioned herein and illustrated in the drawings are referred to by like reference numerals.

Figure 3B:
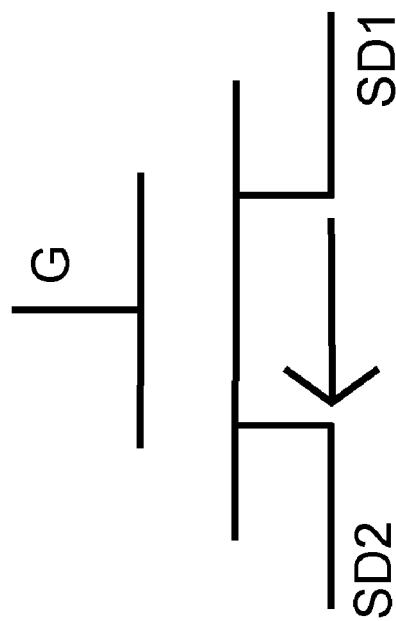
FIG. 3B is a circuit schematic of the field effect transistor according to the present invention.
Figure 3A:
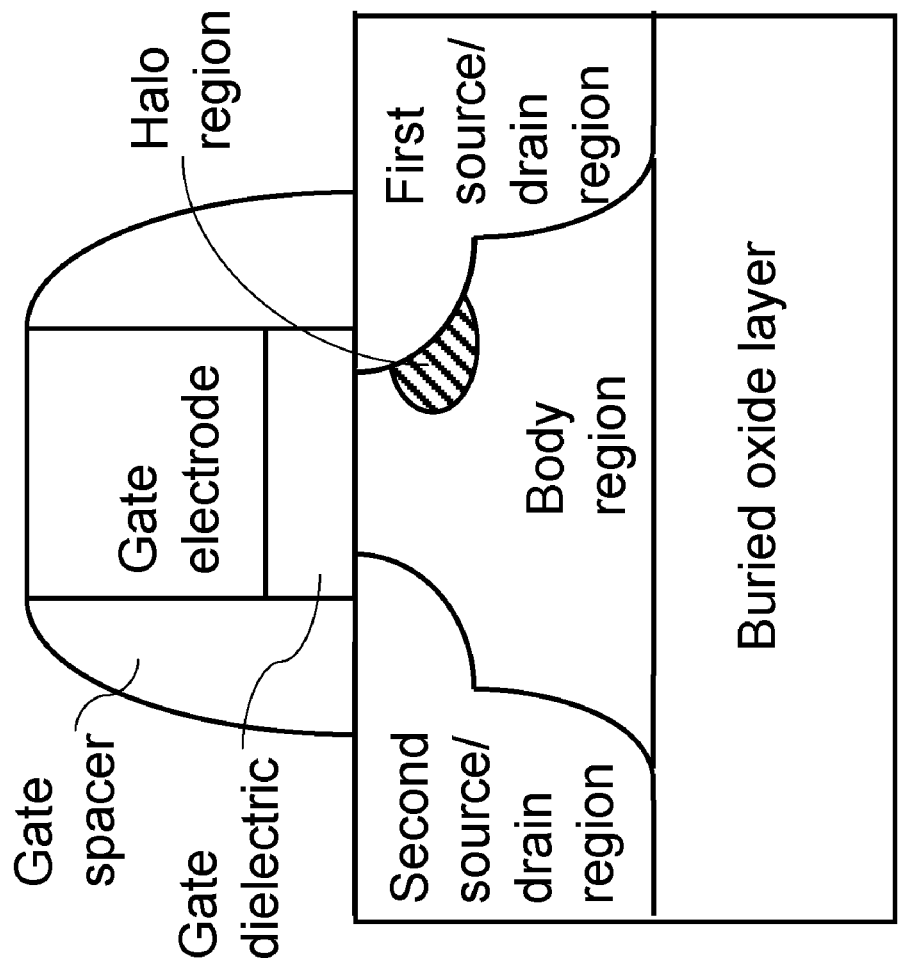
FIG. 3A is a vertical cross-sectional area of a field effect transistor structure according to the present invention.

FIG. 3A shows a vertical cross-sectional area of an exemplary asymmetric field effect transistor according to the present invention, which comprises a semiconductor-on-insulator (SOI) substrate and gate structures. The SOI substrate comprises a buried oxide layer and a top semiconductor layer. The top semiconductor layer includes a body region having a doping of a first conductivity type at a first dopant concentration, a halo region having a doping of the first conductivity type at a second dopant concentration which is greater than the first dopant concentration, a first source/drain region laterally abutting the halo region and having a doping of a second conductivity type, which is the opposite of the first conductivity type, and a second source/drain region having a doping of the second conductivity type. Each of the first source/drain region and the second source/drain region may operate as a source region or as a drain region depending on the biasing condition of the field effect transistor. The first dopant concentration may be from about $1.0\times10^{14}/cm^3$ to about $3.0\times10^{18}/cm^3$, the second dopant concentration may be from about $1.0\times10^{16}/cm^3$ to about $1.0\times10^{20}/cm^3$, and the dopant concentration of the first source/drain region and the second source/drain region may be from about $1.0\times10^{19}/cm^3$ to about $1.0\times10^{21}/cm^3$, although lesser and greater dopant concentration are also contemplated for each doped regions. The body region may abut portions of the first source/drain region, or alternately, the halo region may extend from a top surface of the top semiconductor layer to a top surface of the buried oxide layer so that the body region is disjoined from the first source/drain region. The gate structures include a gate dielectric, a gate electrode, and a gate spacer that surrounds and laterally abuts the gate electrode and the gate dielectric.

FIG. 3B shows a circuit schematic for the exemplary asymmetric field effect transistor structure of FIG. 3A. The presence of the halo region near the first source drain region in the asymmetric field effect transistor structure is schematically represented by a tail of an arrow near a first source/drain terminal represented by SD1. The head of the arrow represents an absence of any halo region near a second source/ drain terminal represented by SD2. The gate electrode is represented by the gate terminal G. The asymmetric field effect transistor provides a higher on-current when the first source/drain terminal SD1 operates as a source and the second source/drain terminal SD2 operates as a drain than when the first source/drain terminal SD1 operates as a drain and the second source/drain terminal SD2 operates as a source. Thus, the arrow represents a direction along which more charge carriers flow when the asymmetric field effect transistor operates in a high on-current mode.

Figure 4:
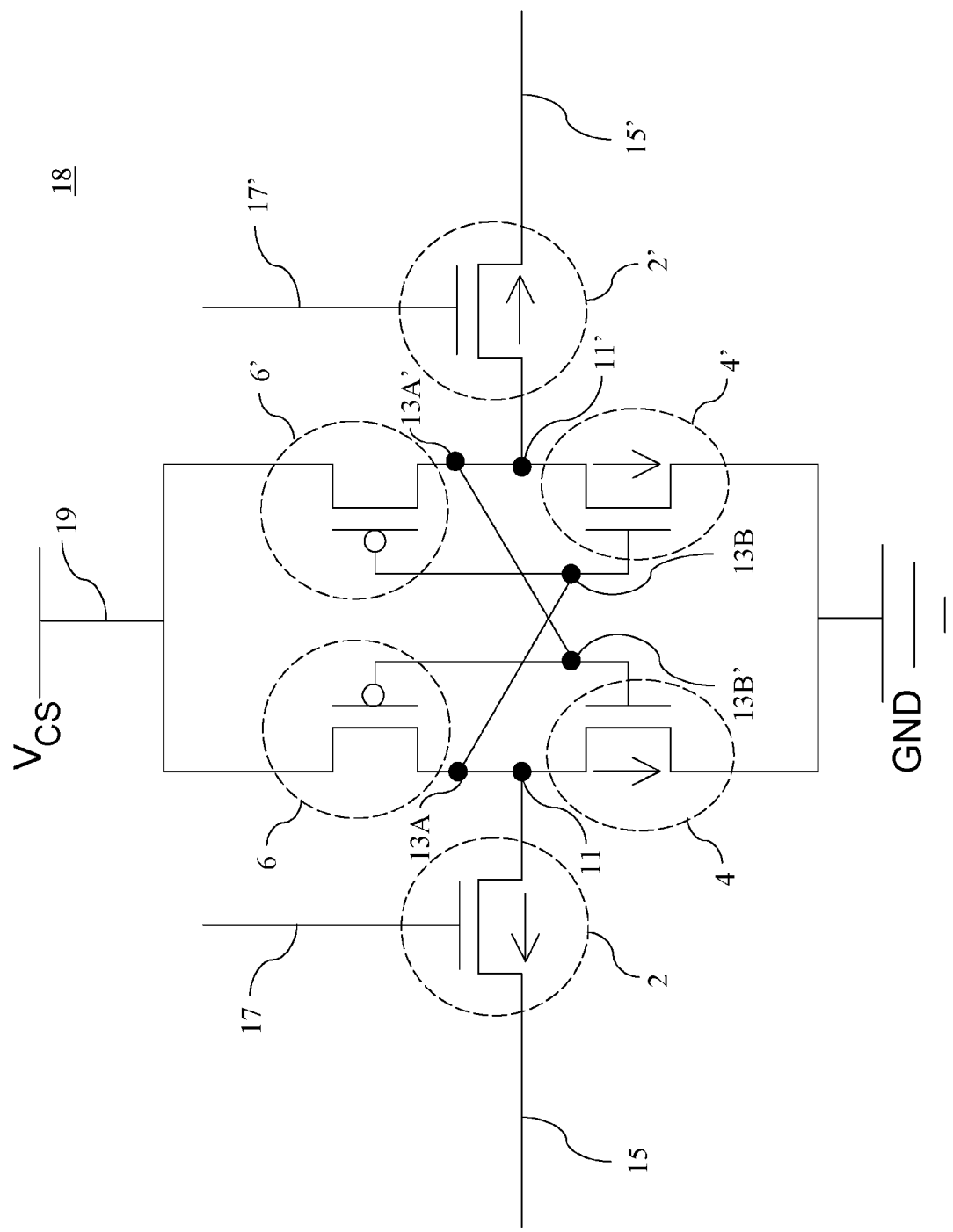
FIG. 4 is a circuit schematic for the SRAM device according to the present invention.

Referring to FIG. 4, a circuit schematic 18 for a static random access memory (SRAM) device shows a first asymmetric pass gate n-type field effect transistor (NFET) 2 and a first asymmetric pull-down n-type field effect transistor (NFET) 4. A first source/drain of the first asymmetric pass gate NFET 2 and a first drain of the first asymmetric pull down NFET 4 are adjoined to form an electrical connection at a first internal node 11. In the physical structure, this electrical connection is achieved by a first active area that contains both the first source/drain of the first asymmetric pass gate NFET 2 and the first drain of the first asymmetric pull-down NFET 4. Similarly, a second source/drain of the second asymmetric pass gate NFET 2' and a second drain of a second asymmetric pull-down NFET 4' are adjoined to form another electrical connection at a second internal node 11'. In the physical structure, this electrical connection is achieved by a second active area that contains both the second source/drain of the second asymmetric pass gate NFET 2' and the second drain of the second asymmetric pull-down NFET 4'. The circuit schematic 18 further comprises a first pull-up p-type field effect transistor (PFET) 6 containing a third drain, which is physically a third active area, and a second pull-up PFET 6' containing a fourth drain, which is physically a fourth active area. Each of the source/drain nodes of the asymmetric pass gate transistors (2, 2') may function as a source or a drain depending on the operation of the SRAM circuit. The sources of the first and second pull-up PFETs (6, 6') are connected to a circuit supply voltage $V_{CS}$ through a power supply wiring 19. The sources of the first and second pull-down NFETs (4, 4') are connected to ground.

The third active area is electrically connected to the first active area through a first set of contact vias and metal wiring. This connection is represented in the circuit schematic 18 by the first internal node 11. Similarly, the fourth active area is electrically connected to the second active area through a second set of contact vias and metal wiring. This connection is represented in the circuit schematic 18 by the second internal node 11'. The second set of contact vias and metal wiring also connects the gates of the second pull-up PFET 6' and the second pull-down NFET 4' to the third drain of the first pull-up PFET 6. This connection is represented in the circuit schematic 18 by a third internal node 13A and a fourth internal node 13B. The first set of contact vias and metal wiring also connects the gates of the first pull-up PFET 6 and the first pull-down NFET 104 to the fourth drain of the second pull-up PFET 6'. This connection is represented in the circuit schematic 18 by a fifth internal node 13A' and a sixth internal node 13B'. The various internal nodes (11, 11', 13A, 13B, 13A', 13B') are connected by CA contact vias, and CA bars, and/or M1 wires. A first bit lines 15 and a second bit line 15' are typically implemented at M1 level, and the first word line 17 and the second word line 17' are typically implemented at M2 level.

Figure 5A:
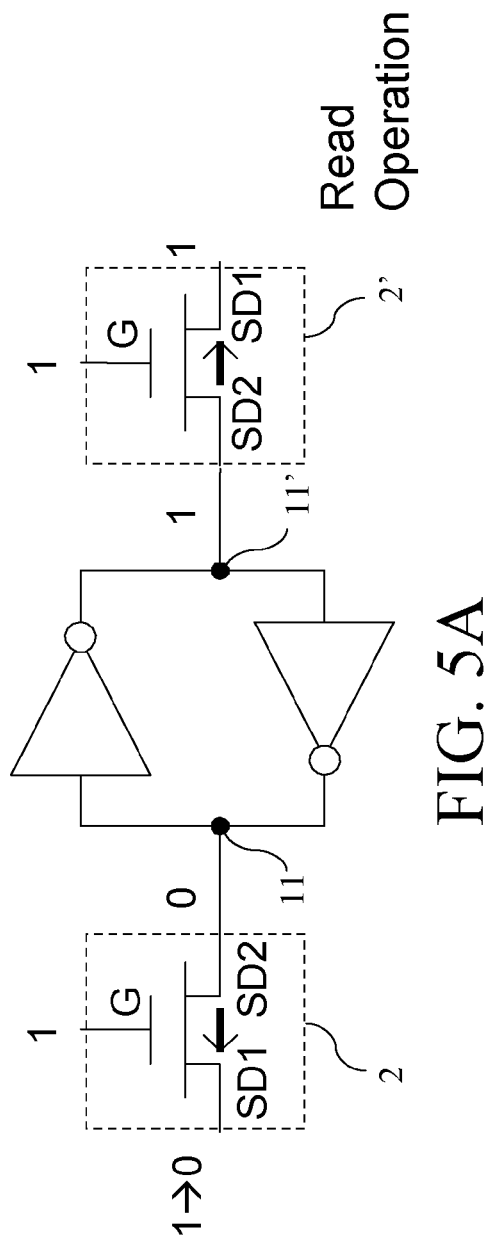
FIG. 5A is a circuit schematic illustrating a read operation of the SRAM device according to the present invention.

Referring to FIG. 5A, operation of the SRAM circuit of the present invention in a read mode is illustrated in another circuit schematic in which the set of the pull-up PFETs (6, 6') and the pull-down NFETs (4, 4') of the circuit schematic 18 in FIG. 4 is represented by an equivalent circuit comprising two coupled inverters. For the purposes of illustration, the first internal node 11 contains a data of "0" and the second internal node 11' contains a data of "1." As the gates G of the two asymmetric pass gate NFETs (2, 2') is sent to a high state, i.e., a "1" state, to turn on the two asymmetric pass gate NFETs (2, 2'), both the first asymmetric pass gate NFET 2 and the second asymmetric pass gate NFET 2' conduct current between a first source/drain terminal SD1 and a second source/drain terminal SD2. The two bit lines (15, 15') are pre-charged to Vdd, or sent to a "1" state before the two asymmetric pass gate NFETs (2, 2') are sent to a high state, or switched "on." The second asymmetric pass gate NFET 2' passes negligible amount of current since both the first source/drain terminal SD1 and the second source/drain terminal SD2 are sufficiently close to the high state, i.e., the "1" state. The first asymmetric pass gate NFET 2 passes a significant amount of transient current before the voltage of the first source/drain terminal SD1 makes a transition from a high state to a low state since the first source/drain terminal SD1 operates as a drain at a high state and the second source/drain terminal SD2 operates as a source at a low state. This causes the voltage in the first bit line 15 to decrease enough for sense amplifier circuit to sense the difference of voltages between the two bit lines (15, 15'). Therefore, the information or state stored in SRAM circuit is obtained.

The integrated total current or total charges through the first asymmetric pass gate NFET 2 is less due to the halo region near the first source/drain terminal SD1 therein than a comparable integrated total current or total charges through a comparable pass gate NFET in a prior art SRAM circuit since the halo region reduces the current through the first asymmetric pass gate NFET 2 in this mode of operation. Thus, the read operation of the inventive SRAM circuit is improved compared to prior art SRAM circuits having symmetric pass gate transistors, i.e., the inventive SRAM circuit provides an enhanced readability. The operation of the SRAM circuit in which the polarity of the data set is flipped, i.e., the first internal node 11 contains a data of "1" and the second internal node 11' contains a data of "0", is the reverse of the case described above.

Figure 5B:
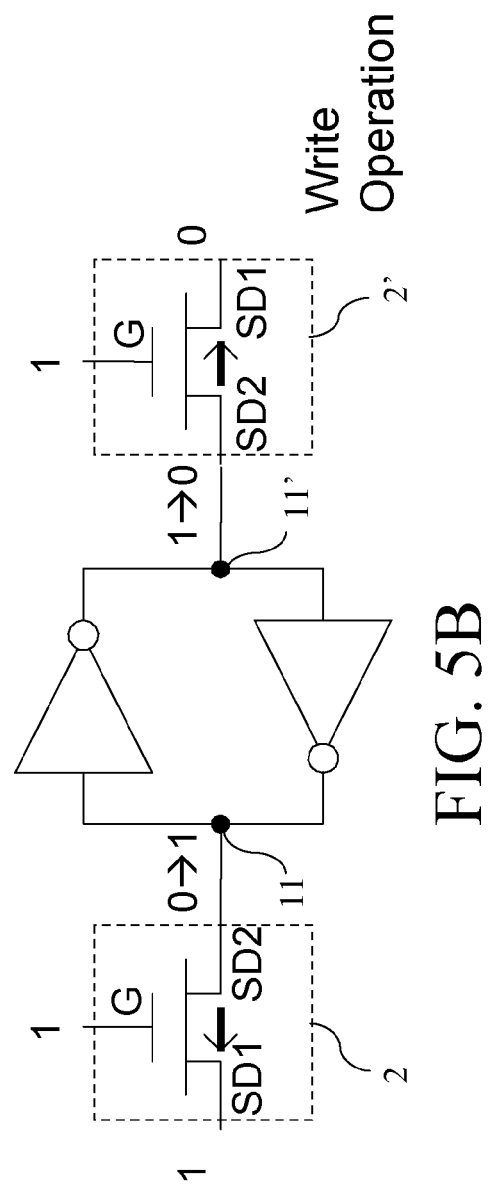
FIG. 5B is a circuit schematic illustrating a write operation of the SRAM device according to the present invention.

Referring to FIG. 5B, operation of the SRAM circuit of the present invention in a write mode is illustrated employing a circuit schematic similar to the circuit schematic of FIG. 5A. For the purposes of illustration, the first internal node 11 initially contains a data of "0" and the second internal node 11' initially contains a data of "1." The data of "1" is to be overwritten onto the first internal node 11, while the data of "0" is to be overwritten onto the second internal node 11'. As the gates G of the two asymmetric pass gate NFETs (2, 2') is sent to a high state, i.e., a "1" state, to turn on the two asymmetric pass gate NFETs (2, 2'), both the first asymmetric pass gate NFET 2 and the second asymmetric pass gate NFET 2' conduct current between a first source/drain terminal SD1 and a second source/drain terminal SD2. Both the first and second asymmetric pass gate NFETs (2, 2') pass a significant amount of current during the process of making a transition of state in the first internal node 11 and the second internal node 11'.

The second asymmetric pass gate NFET 2 passes a significant amount of transient current before the voltage of the second source/drain terminal SD2 makes a transition from a high state to a low state since the second source/drain terminal SD2 operates as a drain at a high state and the first source/drain terminal SD1 operates as a source at a low state. The integrated total current through the second asymmetric pass gate NFET 2' is greater due to the halo region near the first source/drain terminal SD1 therein than a comparable integrated total current through a comparable pass gate NFET in a prior art SRAM circuit since the halo region increases the current through the second asymmetric pass gate NFET 2' in this mode of operation. Thus, the write operation of the inventive SRAM circuit is improved compared to prior art SRAM circuits having symmetric pass gate transistors, i.e., the inventive SRAM circuit provides an enhanced writability. The total integrated current through the first asymmetric pass gate NFET 2 may decrease due to the decrease in the on-current of the first asymmetric pass gate NFET 2 as in the example of the read mode operation due to the halo region at the first source/drain terminal SD1 of the first asymmetric pass gate NFET 2. The operation of the SRAM circuit in which the polarity of the data set is flipped, i.e., the first internal node 11 contains a data of "1" and the second internal node 11' contains a data of "0" prior to the writing and the data to be written has the opposite polarity, is the reverse of the case described above.

Figure 6:
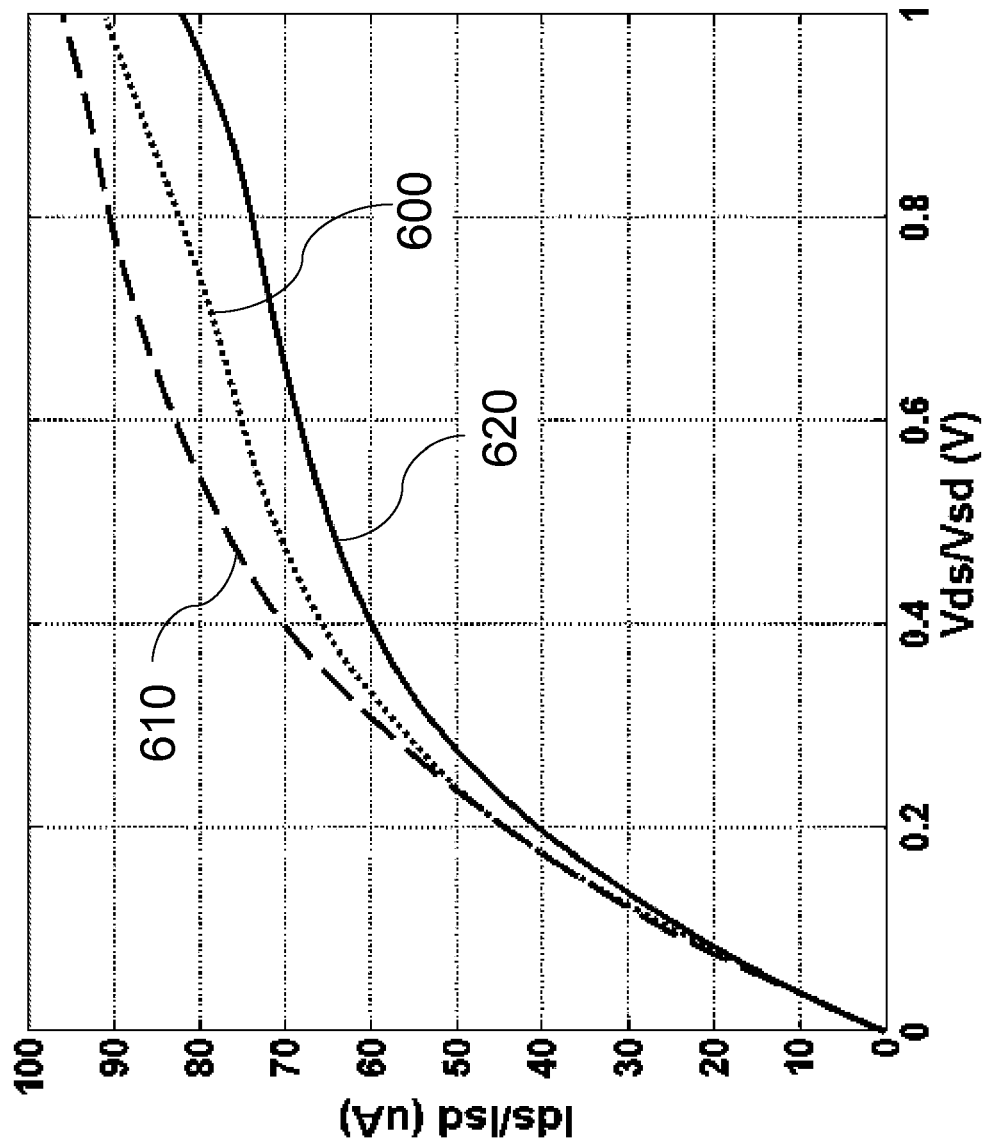
FIG. 6 is a comparison of on-currents of an exemplary symmetric field effect transistor known in the art, of an exemplary asymmetric field effect transistor with a first source/ drain abutting a halo region as a drain, and of the exemplary asymmetric field effect transistor with the first source/drain operating as a source.

Referring to FIG. 6, a graph shows a comparison of on-current curves for an asymmetric pass gate NFET according to the present invention with an on-current curve for a comparable symmetric pass gate NFET. Specifically, a reference on-current curve 600 is an on-current curve for a reference symmetric pass gate NFET according to the prior art, i.e., an NFET having the same physical structure as an exemplary inventive asymmetric pass gate NFET except for the absence of a halo region. The reference symmetric pass gate NFET generates the same on-current curve irrespective of which source/drain terminal is employed as a source terminal or a drain terminal since the reference symmetric pass gate NFET has a symmetrical physical structure, i.e., exactly the same on-current curve is obtained in a forward direction and in a reverse direction. A forward mode on-current curve 610 is an on-current curve for the exemplary inventive asymmetric pass gate NFET containing a halo region when a first source/drain terminal operates as a source and a second/source drain terminal operates as a drain. In this case, the halo region physically abuts a source/drain region, which is a physical implementation of the first source/drain terminal. A reverse mode on-current curve 620 is an on-current curve for the exemplary inventive asymmetric pass gate NFET containing the halo region when the first source/drain terminal operates as a drain and the second/source drain terminal operates as a source. The forward mode on-current curve 610 is located above the reference on-current curve 600, and the reverse mode on-current curve 620 is located below the reference on-current curve 600. This tendency is manifested more clearly as the voltage between the drain and the source (Vds/Vsd) increases.

Figure 2:
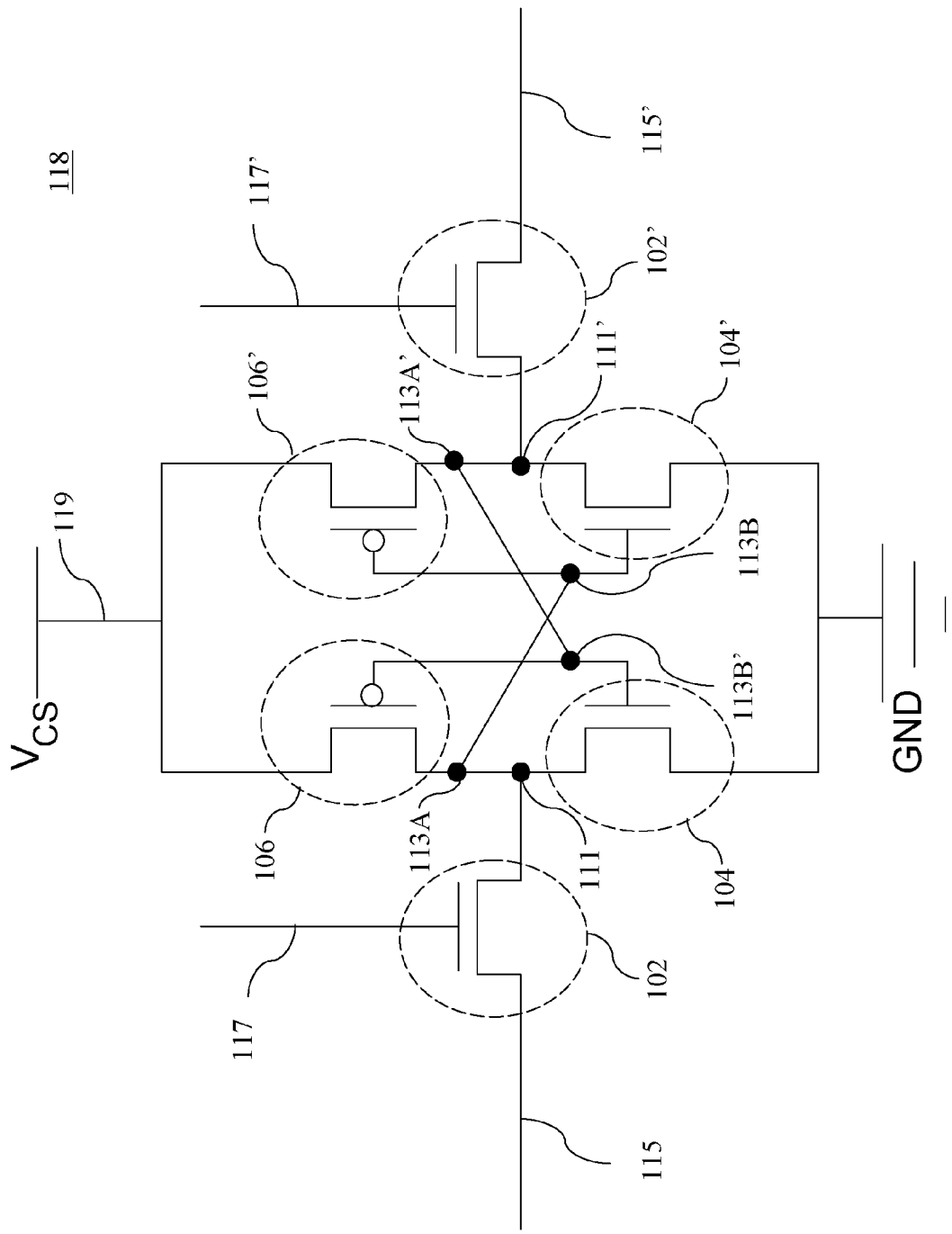
FIG. 2 is a circuit schematic for an exemplary prior art SRAM device.
Figure 7:
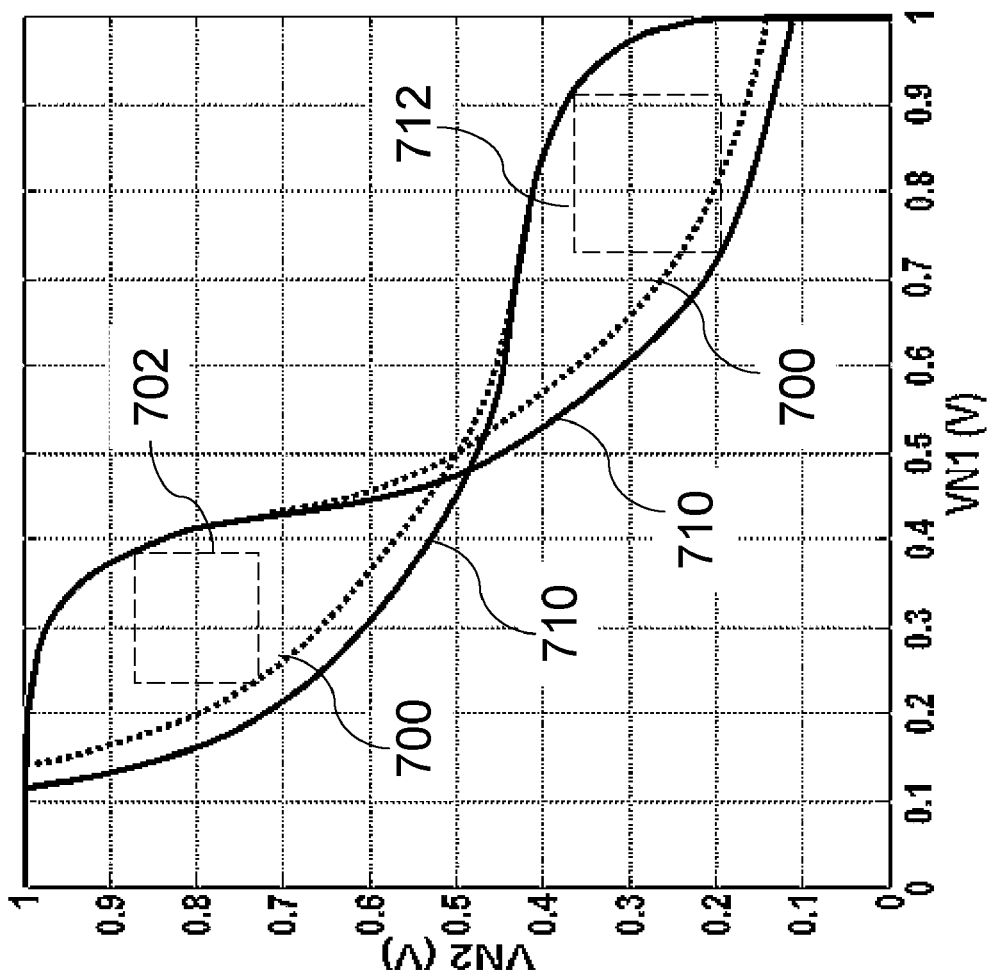
FIG. 7 is a comparison of "butterfly simulations" showing the correlation of the voltages at first and second internal nodes for an exemplary prior art SRAM device and an exemplary SRAM device according to the present invention.

Referring to FIG. 7, a comparison of "butterfly simulations" between a reference prior art SRAM circuit and an exemplary inventive SRAM circuits is shown. A reference butterfly simulation curve 700 shows the correlation of the voltages at a first internal node 111 and a second internal node 111' for the exemplary prior art SRAM circuit of FIG. 2. A butterfly simulation curve 710 of the present invention shows the correlation of the voltages at a first internal node 11 and a second internal node 11' for the exemplary SRAM circuit according to the present invention of FIG. 4. The area of a signal-noise margin square 712 of the present invention, which is a measure of an instantaneous voltage noise that the exemplary inventive SRAM circuit of FIG. 4 may take without flipping the contents of the stored data, is larger than the area of a prior art signal-noise margin square 702, which is a measure of an instantaneous voltage noise that the exemplary prior art SRAM circuit of FIG. 2 may take without flipping the contents of the stored data. Thus, the exemplary SRAM circuit according to the present invention has improved stability in terms of signal-to noise margin compared to prior art SRAM circuits employing symmetric pass gate NFETs. In other words, the present invention improves stability of SRAM circuit through the use of asymmetric pass gate NFETs.

Figure 8B:
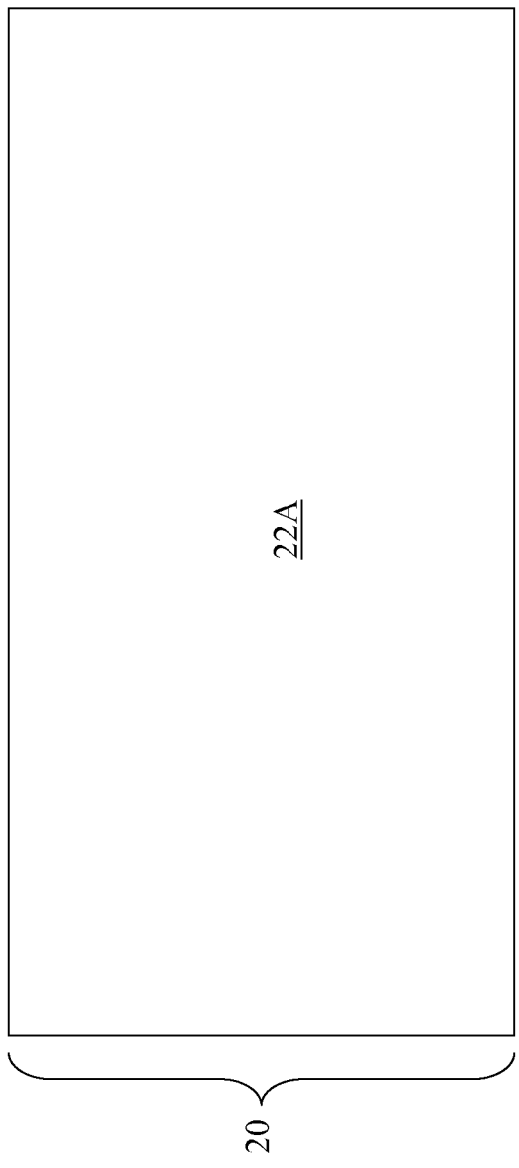
FIGS. 8A-12C are sequential views of an exemplary semiconductor structure according to the present invention. Figures with the same numeric label correspond to the same stage of a manufacturing process. Figures with the suffix "A" are top-down views. Figures with the suffix "B" are vertical cross-sectional views along the plane B-B' of the corresponding figure with the same numeric label and the suffix "A." Figures with the suffix "C" are vertical cross-sectional views along the plane C-C' of the corresponding figure with the same numeric label and the suffix "A."
Figure 8C:
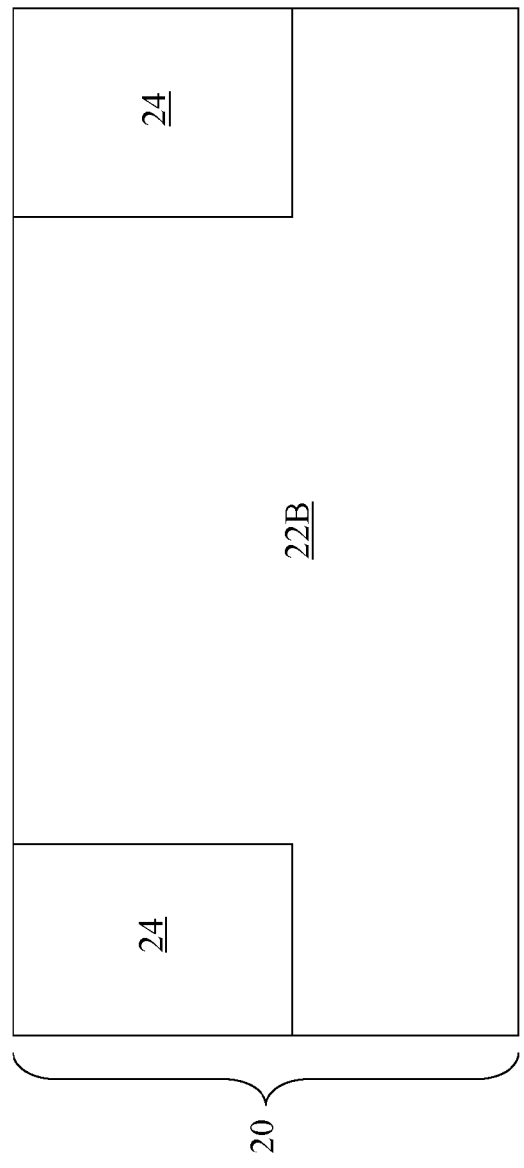

Referring to FIGS. 8A-8C, an exemplary semiconductor structure according to the present invention comprises a semiconductor substrate 20 containing first semiconductor regions 22A and second semiconductor regions 22B. The first and second semiconductor regions (22A, 22B) comprise a semiconductor material, which may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. In one embodiment, the first and second semiconductor regions (22A, 22B) are portions of a single crystalline semiconductor material, i.e., have the same crystallographic orientations throughout the volume of the first and second semiconductor regions (22A, 22B). In another embodiment, the first semiconductor regions 22A and the second semiconductor regions 22B have different crystallographic orientations.

The semiconductor substrate 20 may be a bulk substrate, a semiconductor-on-insulator (SOI) substrate, or a hybrid substrate having a bulk portion and an SOI portion. While the present invention is described employing a bulk substrate, embodiments employing an SOI substrate or a hybrid substrate are explicitly contemplated herein.

The first semiconductor regions 22A have a p-type doping and the second semiconductor regions 22B have an n-type doping. If the semiconductor substrate 20 is a bulk substrate having a doping of one conductivity type, i.e., comprises a semiconductor portion extending from a top surface of the semiconductor substrate 20 to a bottom surface of the semiconductor substrate 20 without any buried insulator layer therein, the first semiconductor regions 22A or the second semiconductor regions 22B are typically formed in a "well" which has a doping of an opposite conductivity type than the doping of the bulk substrate. For example, if the semiconductor substrate 20 is a p-type bulk substrate, the second semiconductor regions 22B are formed in n-type wells, and if the semiconductor substrate 20 is an n-type bulk substrate, the first semiconductor regions 22A are formed in p-type wells. Alternately, both the first semiconductor regions 22A and the second semiconductor regions 22B may be formed in doped wells.

Each of the first semiconductor regions 22A comprises narrow portions having a lesser width and wide portions having a greater width. Asymmetric pass gate n-type field effect transistors (NFETs) are subsequently formed on the narrow portions and pull-down n-type field effect transistors (NFETs) are subsequently formed on the wide portions. The ratio of the widths between the wide portions and the narrow portions is from about 1.5 to about 2.5, which provides current ratio from about 1.5 to about 2.5 between the asymmetric pass gate NFETs in forward mode operation and pull-down NFETs so that optimal stability is achieved for the static random access memory (SRAM) cells formed from the exemplary semiconductor structure. The width of the second semiconductor regions 22 is typically about the same as the width of the narrow portions of the first semiconductor regions 22A.

Shallow trenches are formed in the semiconductor substrate 20 by methods known in the art such as lithographic patterning of the area for the shallow trenches followed by an anisotropic etch that removes the semiconductor material of the semiconductor substrate 20. A dielectric material is deposited into the shallow trenches and planarized to form a shallow trench region 24 that laterally surrounds the first and second semiconductor regions (22A, 22B). The dielectric material typically comprises a silicon oxide based material such as undoped silicate glass (USG). The dielectric material may be deposited, for example, by high density plasma chemical vapor deposition (HDPCVD), plasma enhanced chemical vapor deposition (PECVD), low pressure chemical vapor deposition (LPCVD), etc. The top surface of the shallow trench isolation region 24 may be substantially coplanar with top surfaces of the first and second semiconductor regions (22A, 22B).

Figure 9C:
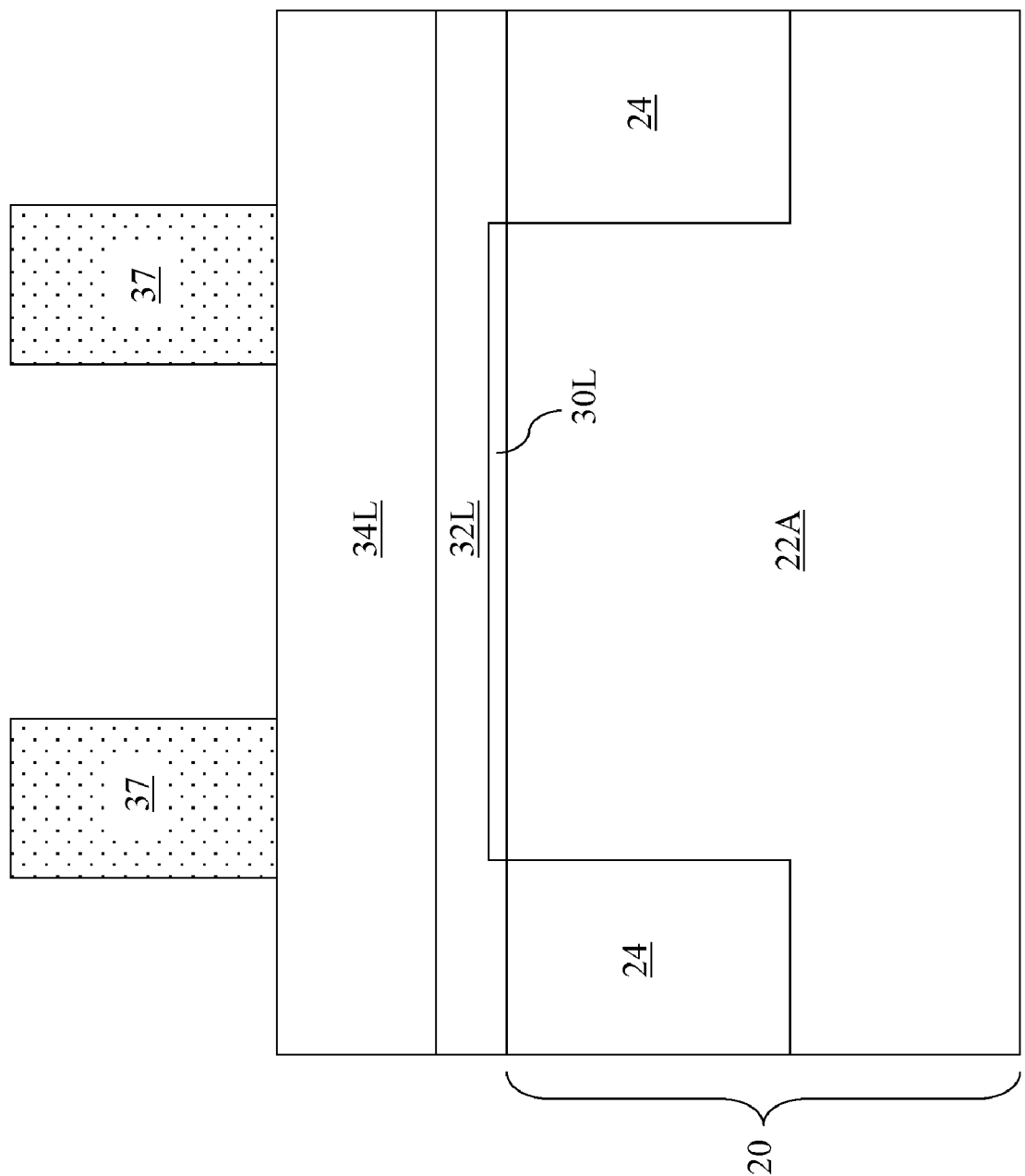

Referring to FIGS. 9A-9C, a gate dielectric layer 30 comprising a dielectric material is formed on the top surfaces of the first and second semiconductor regions (22A, 22B). The gate dielectric layer 30 comprises an oxide-containing dielectric material, which may be a silicon oxide based dielectric material or a high-k gate dielectric material comprising a dielectric metal oxide such as $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from about 0.5 to about 3 and each value of y is independently from 0 to about 2. If the gate dielectric layer 30L comprises a silicon oxide based dielectric material, the gate dielectric layer 30L may be formed by thermal oxidation with an optional thermal nitridation. If the gate dielectric layer 30L comprises a high-k gate dielectric material, the gate dielectric layer may be formed by methods well known in the art including, for example, a chemical vapor deposition (CVD), an atomic layer deposition (PVD), molecular beam epitaxy (MBE), pulsed laser deposition (PLD), liquid source misted chemical deposition (LSMCD), atomic layer deposition (ALD), etc. The effective oxide thickness (EOT) of the gate dielectric layer 30 may be from about 0.8 nm to about 10 nm, and preferably from about 1.2 nm to about 6 nm, although lesser and greater thicknesses are also explicitly contemplated herein.

A semiconductor layer 32L is formed directly on the gate dielectric layer 30. The semiconductor layer 32L comprises a polycrystalline or amorphous semiconductor material that may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. The semiconductor layer 32L may be formed by low pressure chemical vapor deposition (LPCVD), rapid thermal chemical vapor deposition (RTCVD), plasma enhanced chemical vapor deposition (PECVD), etc. The thickness of the semiconductor layer 32L may be from about 5 nm to about 50 nm, and typically from about 10 nm to about 20 nm, although lesser and greater thicknesses are also contemplated herein. The semiconductor layer 32L may be in-situ doped, i.e., doped during the deposition process, or may be doped subsequently after the deposition. Yet alternately, the semiconductor layer 32L may be left undoped at this point such that dopants introduced into conductive stripes to be subsequently formed can diffuse into remaining portions of the semiconductor layer 32L.

A dielectric layer 34L is formed directly on the semiconductor layer 32L. The dielectric layer 34L comprises a dielectric material such as silicon oxide or silicon nitride, and may be formed by chemical vapor deposition. The thickness of the dielectric layer 34L may be from about 20 nm to about 200 nm, and typically from about 40 nm to about 150 nm, although lesser and greater thicknesses are also contemplated herein.

A first photoresist 37 is applied over the dielectric layer 34L and lithographically patterned to form lines running perpendicular to the direction of lengthwise edges of the first and second semiconductor portions (22A, 22B). One edge of each patterned line of the first photoresist 37 overlies the shallow trench isolation region 24 in the vertical plane C-C' of FIG. 9C.

Figure 10B:
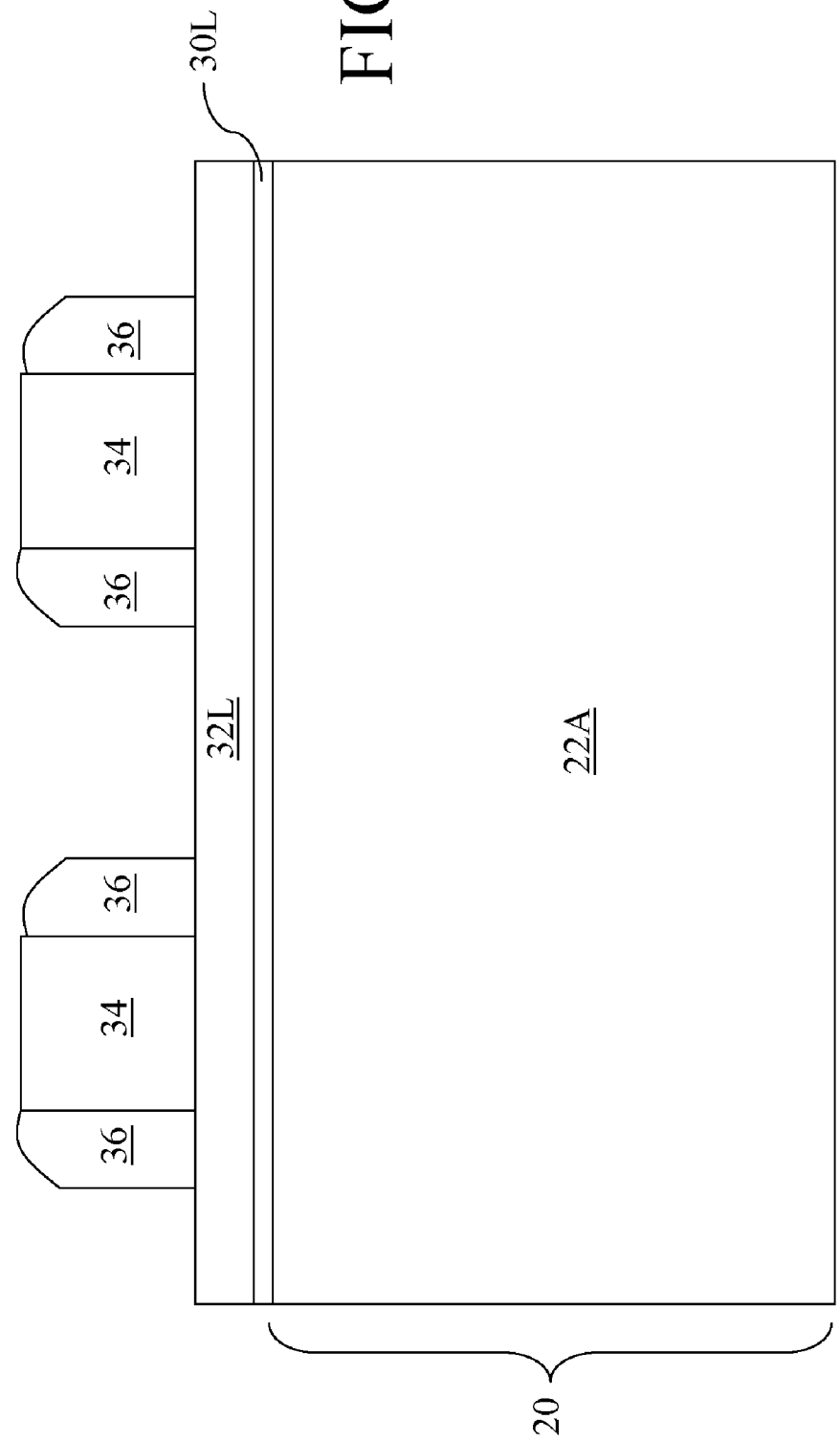
Figure 10C:
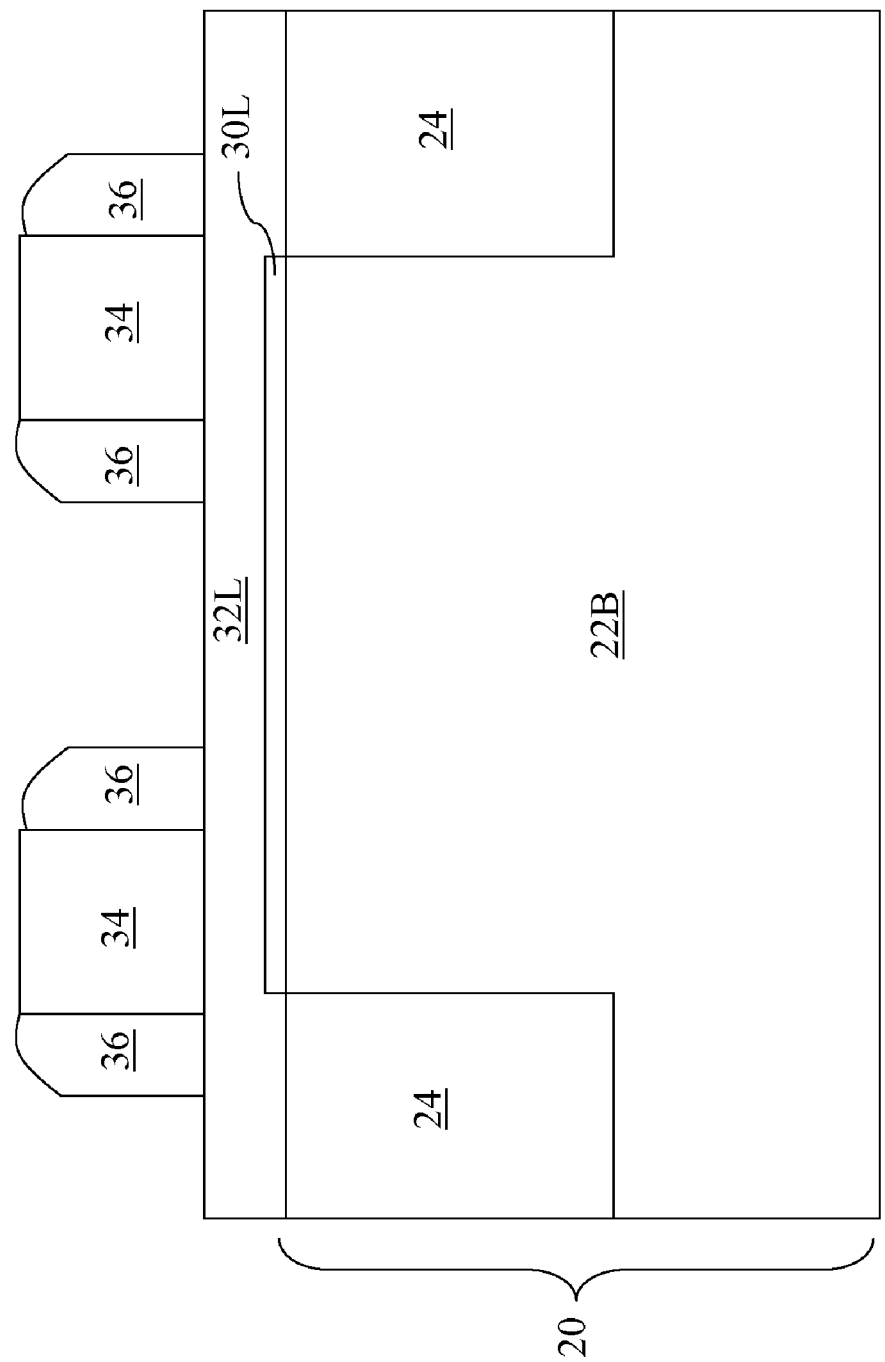

Referring to FIGS. 10A-10C, the pattern in the first photoresist 37 is transferred into the dielectric layer 34L by an anisotropic etch such as a reactive ion etch. Not necessarily but preferably, the anisotropic etch is selective to the semiconductor layer 32L. The remaining portions of the dielectric layer 34L constitute dielectric lines 34 that run perpendicular to the direction of the lengthwise edges of the first and second semiconductor portions (22A, 22B). Conductive stripes 36 are formed on the sidewalls of the dielectric lines 34 by depositing a conformal layer of a conductive material and an anisotropic etch that removed horizontal portions of the conformal layer. The method of forming conductive stripes 36 is similar to the methods employed to form gate spacers with the difference being that the dielectric lines 34 are employed instead of gate electrodes, and that the conductive stripes 36 comprise the conductive material while typical gate spacers comprise a dielectric material.

The conductive stripes 36 may comprise a metal, a conductive metal compound, a conductive semiconductor material containing p-type dopants or n-type dopants, or a combination thereof. In case the conductive stripes 36 comprise a metal or a conductive metal compound, materials employed for metal gate structures known in the art may be employed. In case the conductive stripes 36 comprise a semiconductor material, the conductive stripes 36 may comprise a polycrystalline or amorphous semiconductor material that may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. Not necessarily but preferably, the conductive stripes 36 comprise a different material than the semiconductor layer 32L so that the anisotropic etch forming the conductive stripes 36 may be selective to the semiconductor layer 32L. The lateral width of the conductive stripes 36 is substantially the same as the width of gate electrodes to be subsequently formed for the various field effect transistors in the exemplary semiconductor structure.

Figure 11A:
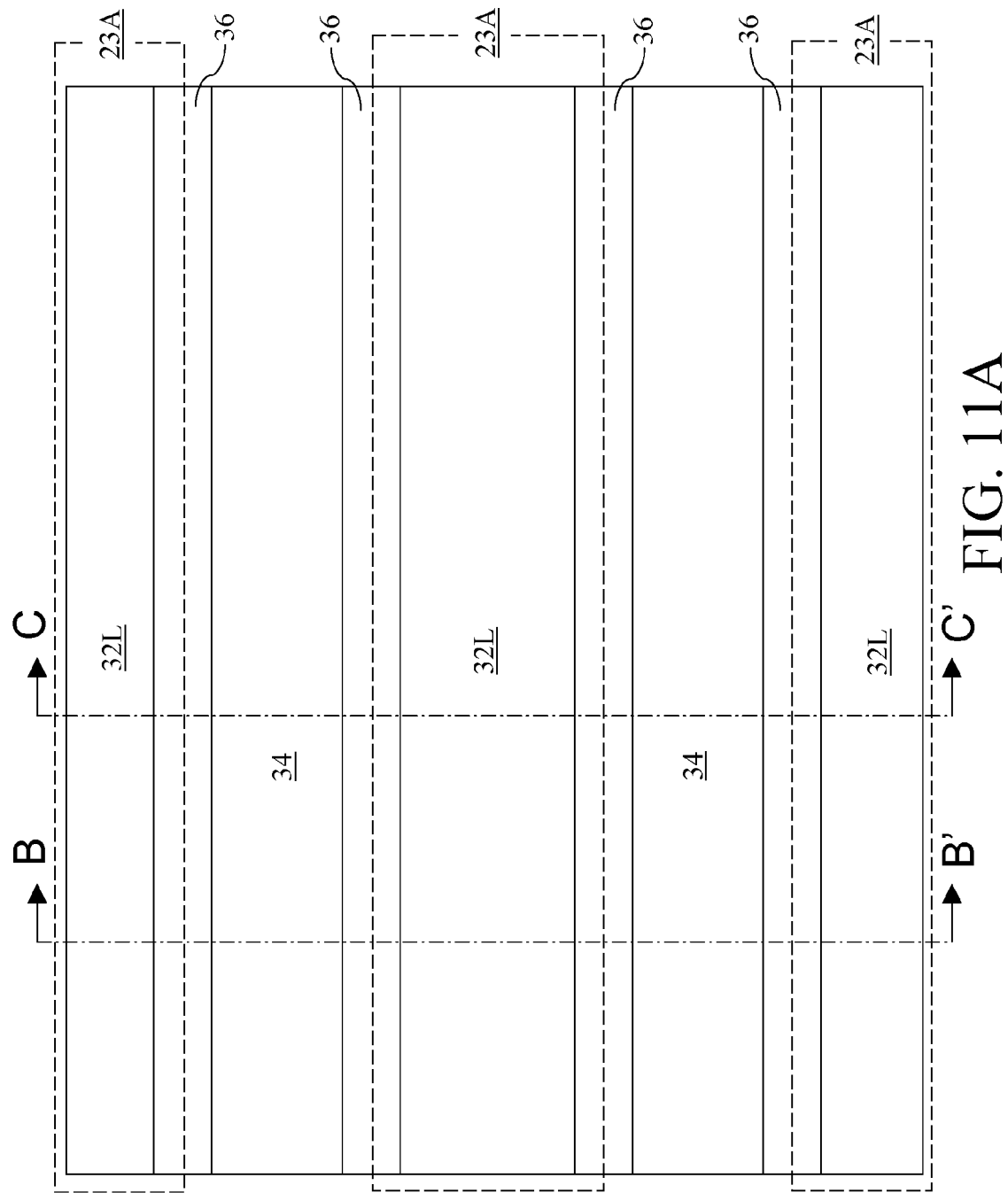
Figure 11B:
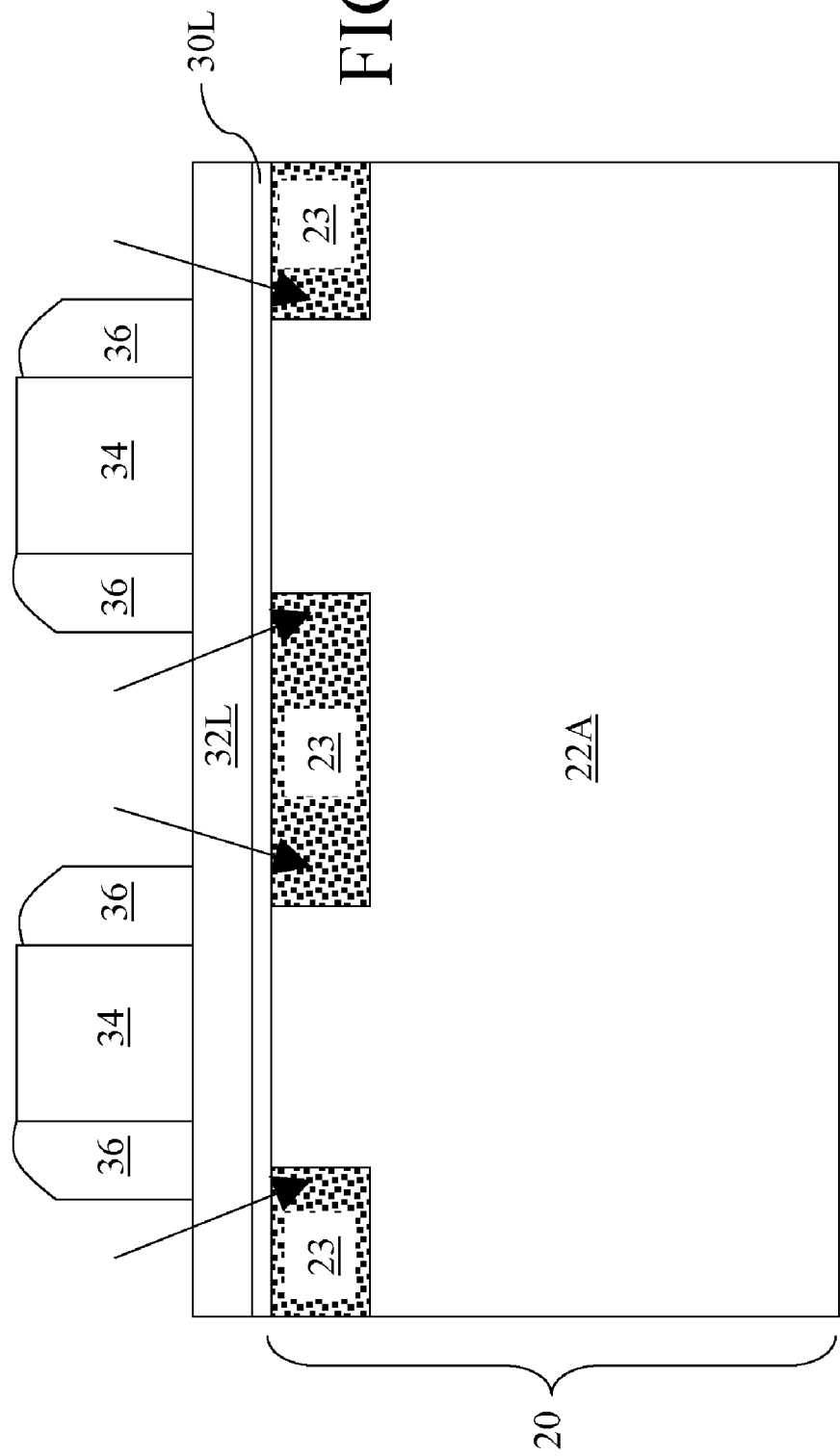
Figure 11C:
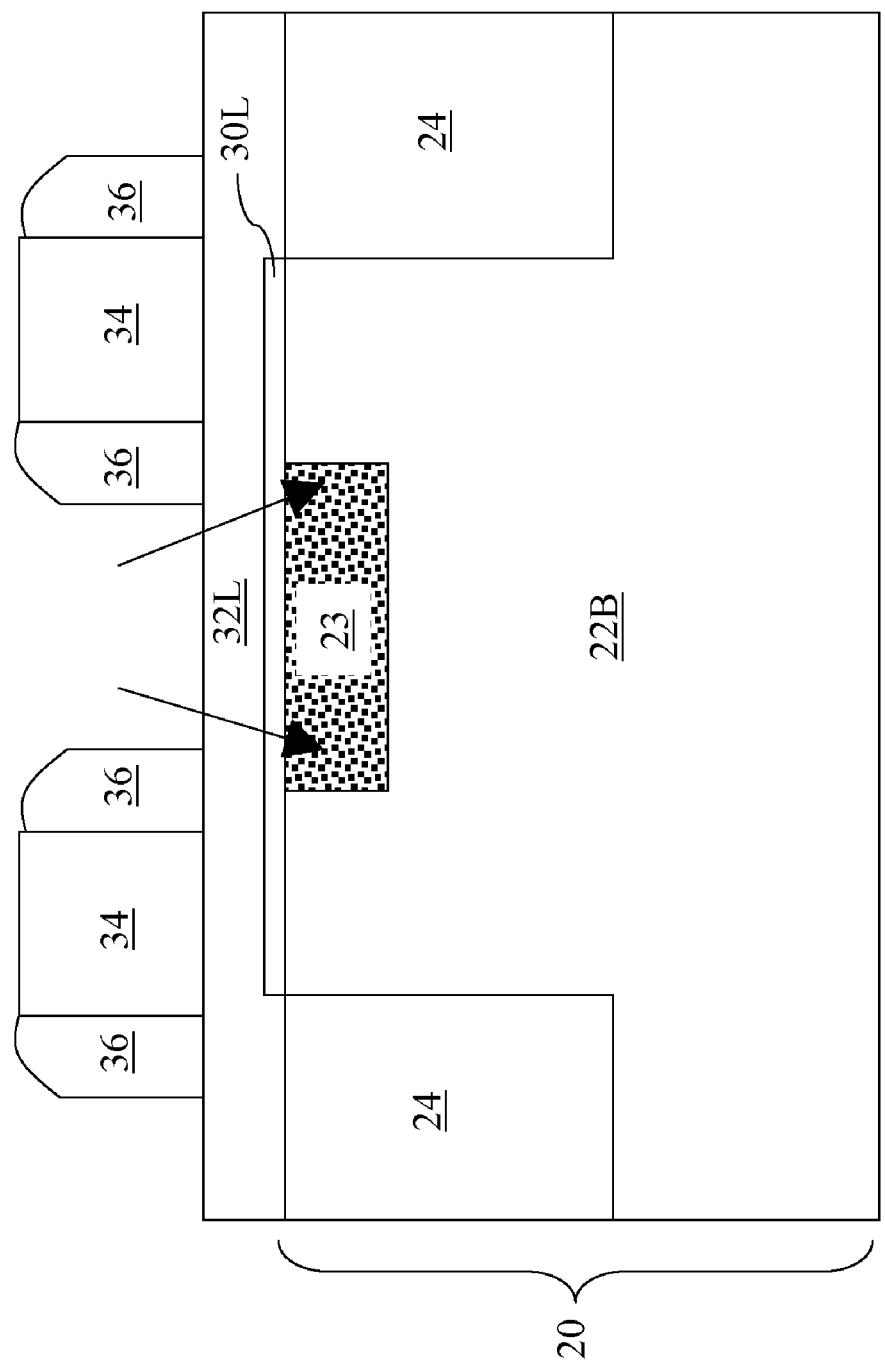

Referring to FIGS. 11A-11C, halo regions 23 are formed in the first and second semiconductor regions 22A by implanting p-type dopants employing the dielectric lines 34 and the conductive stripes 36 as an implantation mask. The p-type dopants are implanted at an angle so that the edges of the halo regions 23 underlie the conductive stripes 36. The angle of the ion implantation is selected so that the halo regions 23 do not underlie the entirety of any of the dielectric lines 34, i.e., one edge of each conductive stripes 36 overlies one of halo regions, while the other edge of the same conductive stripe 36 overlies a portion of the first or second semiconductor regions (22A or 22B) that abut the gate dielectric layer 30L.

Halo areas 23A, or the collective areas of the halo regions 23 as seen in a see-through top-down view, is marked as dashed lines in the top-down view of FIG. 11A. The p-type dopants that are implanted into the shallow trench isolation region 24 are absorbed into the dielectric material of the shallow trench isolation region 24 without significant effect on device performance.

Figure 12A:
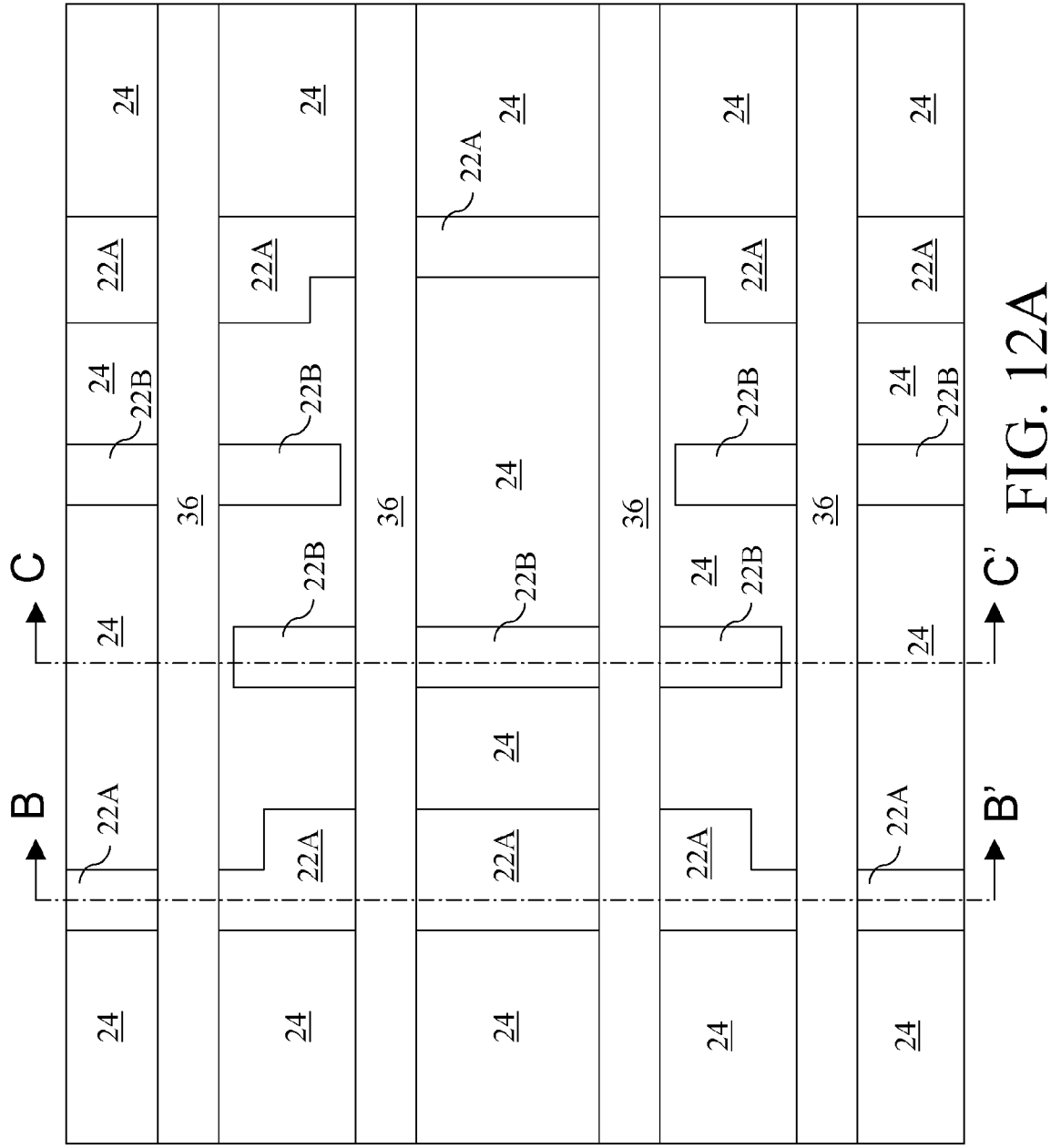
Figure 12B:
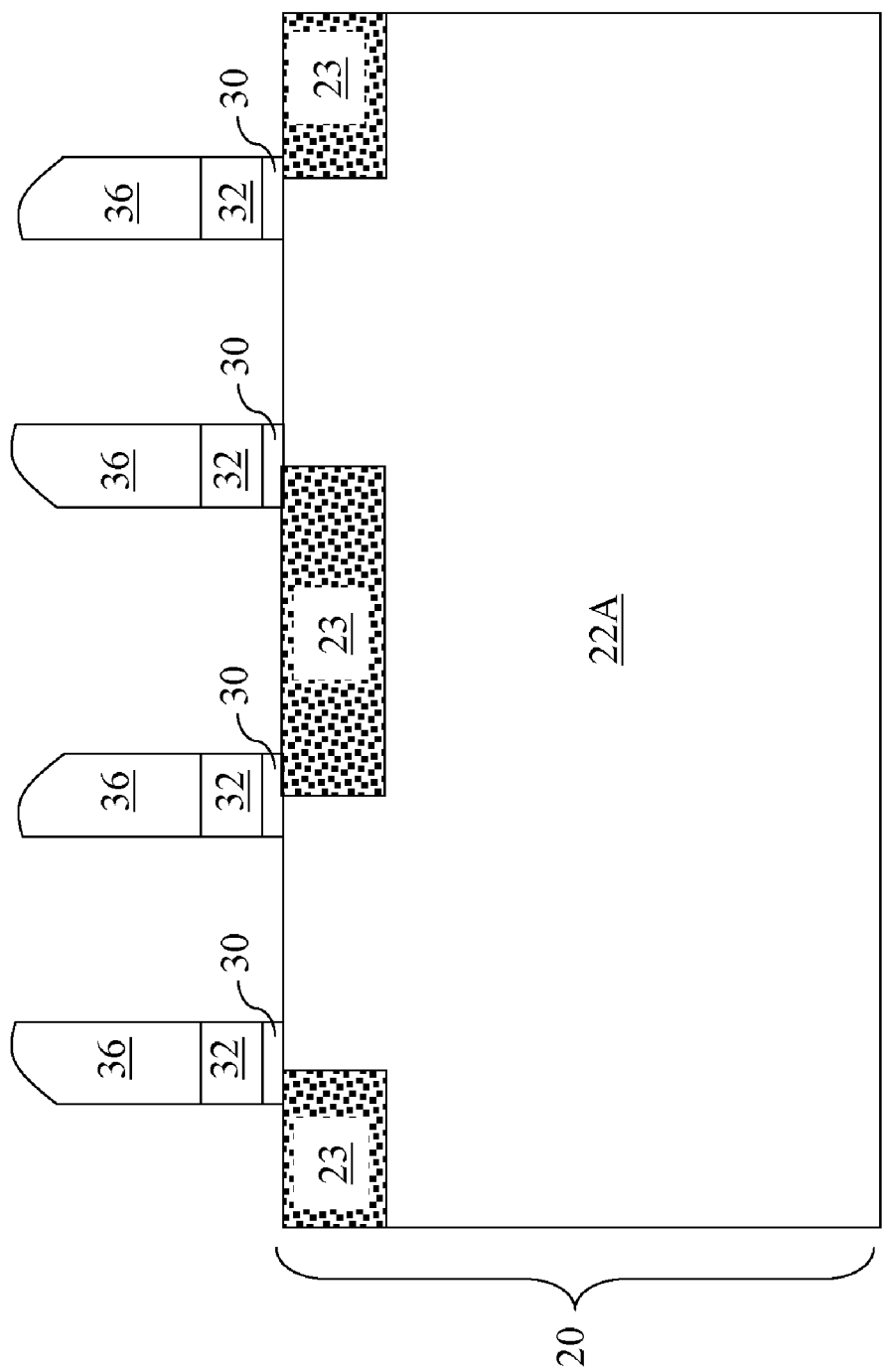
Figure 12C:
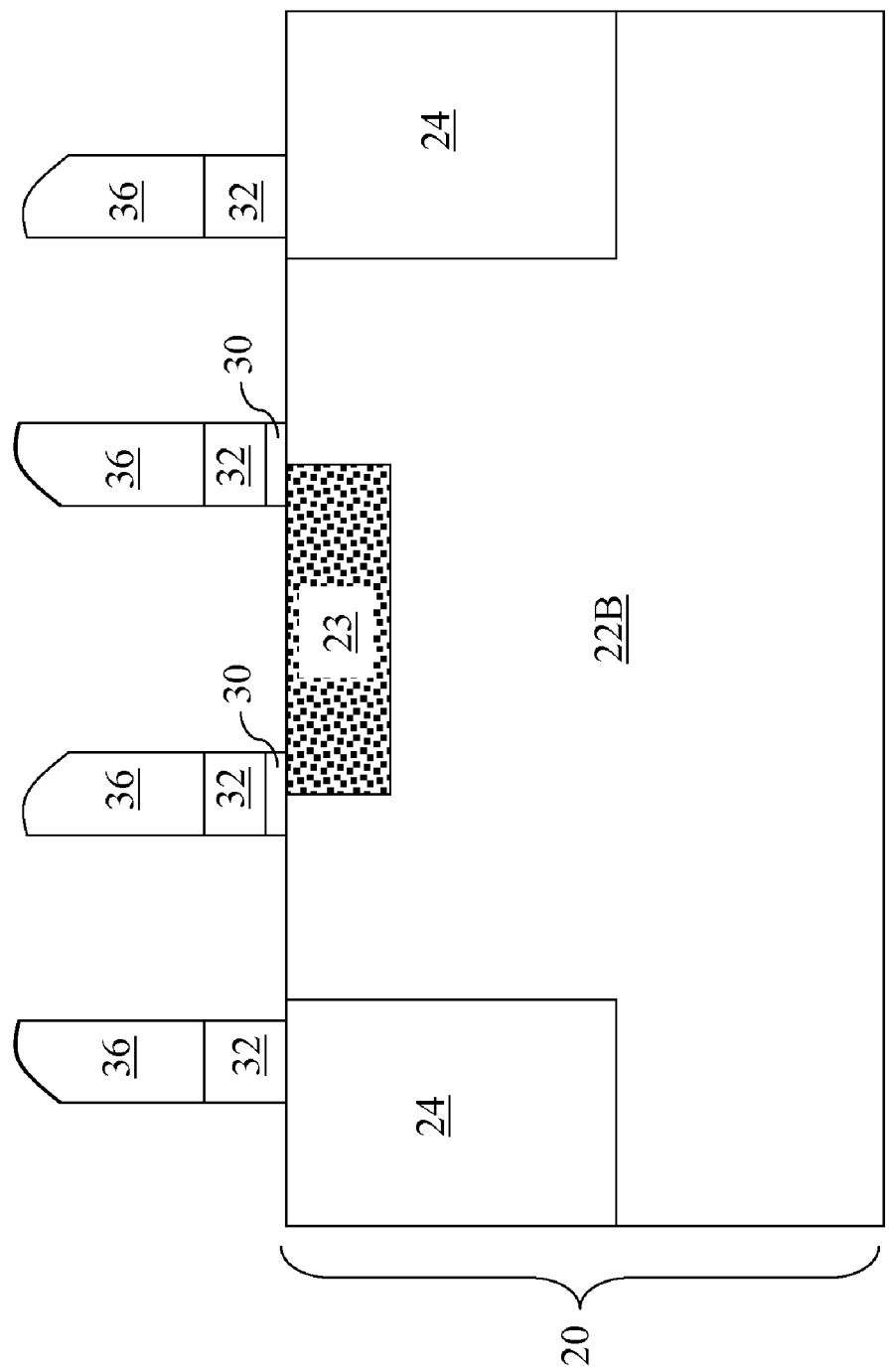

Referring to FIGS. 12A-12C, the dielectric lines 34 are removed selective to the conductive stripes 36 and the semiconductor layer 32L by an etch, which may be a wet etch or a dry etch. For example, if the dielectric lines 34 comprise silicon oxide, a hydrofluoric acid (HF) based wet etch may be employed to remove the dielectric lines 34 selective to the conductive stripes 36 and the semiconductor layer 32L. If the dielectric lines 34 comprise silicon nitride, a hot phosphoric acid based wet etch may be employed to remove the dielectric lines 34 selective to the conductive stripes 36 and the semiconductor layer 32L.

The pattern of the conductive stripes 36, which is a set of lines running in the direction perpendicular to the lengthwise directions of the first and second semiconductor regions (22A, 22B), is transferred into the semiconductor layer 32L, and then transferred into the gate dielectric layer 30L wherever the gate dielectric layer 30L is present. Remaining portions of the semiconductor layer 32L constitute first gate electrode portions 32. Each conductive stripe 36 vertically abuts one of the first gate electrode portions 32, and is electrically shorted thereto. Thus, each conductive stripe 36 is a second gate electrode portion. A first gate electrode portion 32 and a conductive stripe 36 directly thereupon which is also a second gate electrode portion collectively constitute a gate electrode for transistors of the exemplary semiconductor structure.

The remaining portions of the gate dielectric layer 30L constitute gate dielectrics 30. The sidewalls of the second gate electrode portions, which are the conductive stripes 36, the sidewalls of the first gate electrode portions 32, and the sidewalls of the gate dielectrics 30 are substantially vertically coincident since the conductive stripes 36 is the etch template for the first gate electrode portions 32 and the gate dielectrics 30.

Figure 13:
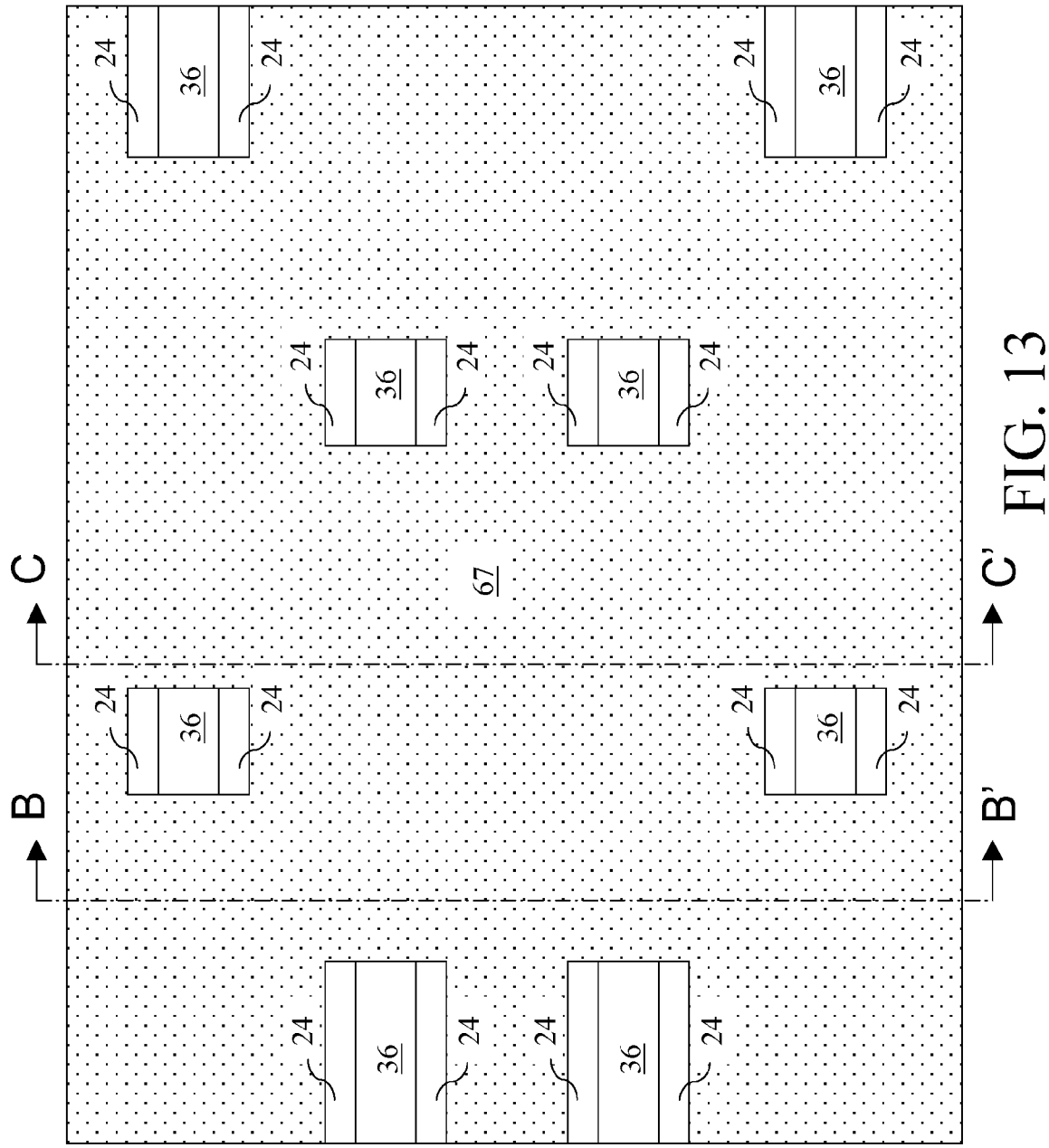
FIGS. 13 and 14 are sequential top-down views of the exemplary semiconductor structure according to the present invention after the processing steps corresponding to FIGS. 12A-12C.

Referring to FIG. 13, a second photoresist 67 is applied over the gate electrodes (32, 36) and the semiconductor substrate 20. The second photoresist 67 is lithographically patterned to expose holes in areas from which portions of the gate electrodes (32, 36) are to be removed, i.e., from which the gate electrodes (32, 36) are to be cut.

An anisotropic etch such as a reactive ion etch is subsequently performed employing the second photoresist 67 as an etch mask to remove the portions of the conductive stripes 36 and the first gate electrode portions 32 from within the openings in the second photoresist 67. Exposed portions of the gate dielectrics 32 may, or may not, be removed without affecting the functionality of the exemplary semiconductor structure in any significant way since the gate dielectrics 32 comprise an insulating material. The second photoresist 67 is subsequently removed. A surface clean may optionally be performed.

Figure 14:
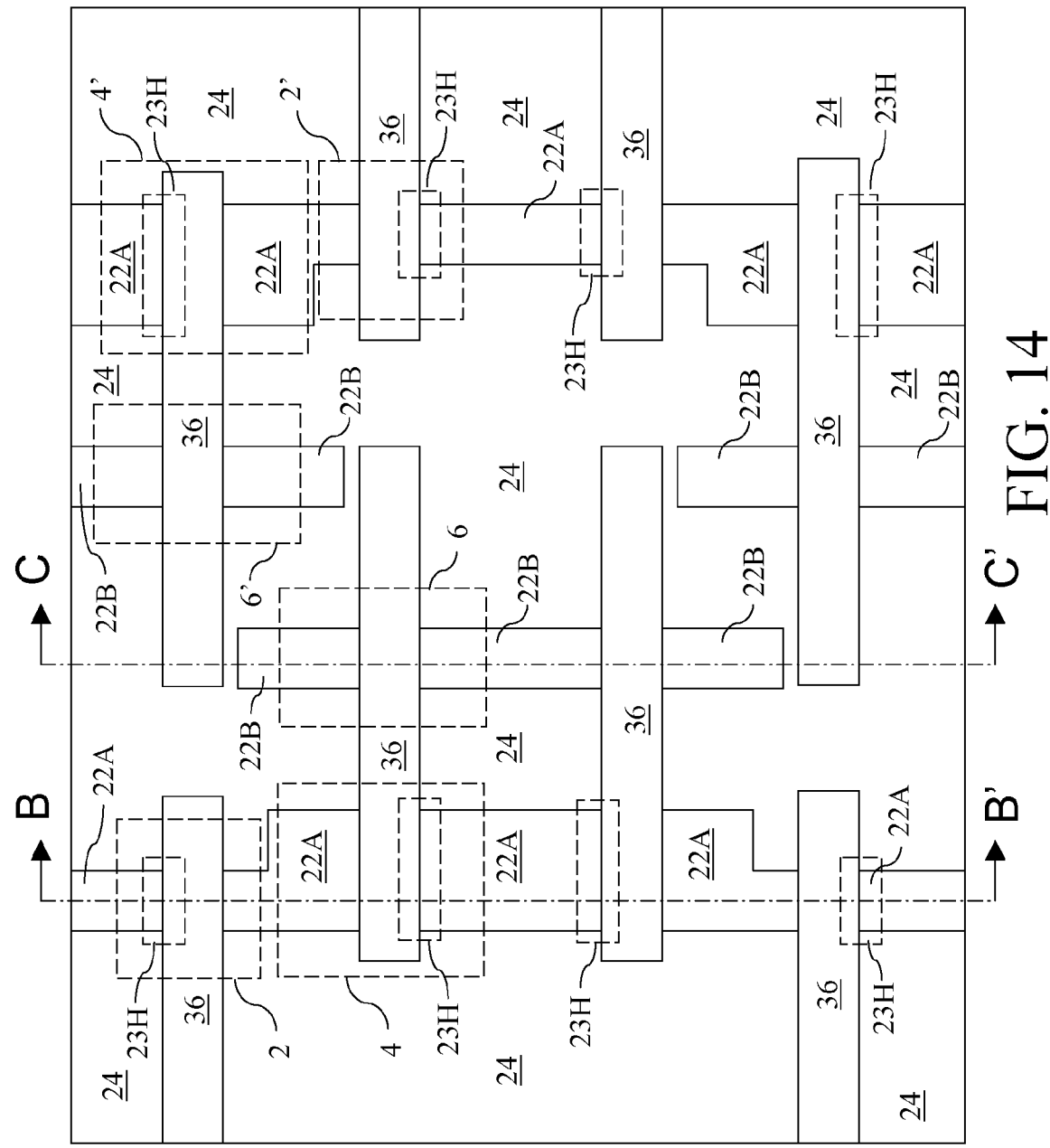

Referring to FIG. 14, masked ion implantations are performed to form source regions (not shown), drain regions (not shown), and source/drain regions (not shown) in the exemplary semiconductor structure. The source regions refer to the portions of the first and second semiconductor regions (22A, 22B) that function only as a source terminal. The drain regions refer to the portions of the first and second semiconductor regions (22A, 22B) that function only as a drain terminal. The source/drain regions refer to the portions of the first semiconductor regions 22A that may function as a source terminal or a drain terminal. The volume of halo regions 23H, the area of which as seen in a see-through top-down view is shown in dotted lines in FIG. 14, decrease as implanted portions of the first and second semiconductor regions (22A, 22B) are converted into the source regions, the drain regions, or the source/drain regions. Each transistor formed on the first semiconductor regions 22A is an n-type field effect transistor having a vertical cross-sectional view of FIG. 3A, or an equivalent transistor in which the functions of the first source/drain region and the second source/drain region are fixed as a source region or a drain region.

Some of the devices are labeled in FIG. 14, from which unlabeled devices may readily be identified by symmetry considerations. The labeled devices include one complete set of transistors that form one static random access memory (SRAM) cell according to the present invention. A first asymmetric pass gate n-type field effect transistor (NFET) 2 comprises a halo region 23H. A first source/drain region (not shown) abuts the halo region 23H in the first asymmetric pass gate NFET 2. A second asymmetric pass gate NFET 2' comprises another halo region 23H. Another first source/drain region (not shown) abuts the halo region 23H in the second asymmetric pass gate NFET 2'.

A first pull-down NFET 4 comprises yet another halo region 23H. A first pull-down NFET source region (not shown) abuts that halo region 23H. A first pull-down NFET drain region is located on an opposite side of the gate electrode (32, 36) of the first pull-down NFET, and is disjoined from that halo region 23H. A second pull-down NFET 4' comprises still another halo region 23H. A second pull-down NFET source region (not shown) abuts that halo region 23H. A second pull-down NFET drain region is located on an opposite side of the gate electrode (32, 36) of the second pull-down NFET, and is disjoined from that halo region 23H.

A first pull-up p-type field effect transistor (PFET) 6 comprises a first pull-up PFET source region (not shown) and a first pull-up PFET drain region (not shown). A second pull-up PFET 6' comprises a second pull-up PFET source region (not shown) and a second pull-up PFET drain region (not shown).

Each of the first and second asymmetric pass gate NFETs (2, 2') comprises a first source/drain region, which functions as a first source/drain terminal, and a second source/drain region, which functions as a second source/drain terminal. Each of the first and second asymmetric pass gate NFETs (2, 2') provides a greater on-current when the first source/drain region operates as a source and the second source/drain region operates as a drain than when the first source/drain region operates as a drain and the second source/drain region operates as a source. Further, all transistor characteristics including on-current, off-current, and threshold voltages are substantially matched between the first and second asymmetric pass gate NFETs (2, 2').

The first pull-down NFET 4 and the second pull-down NFET 4' have an on-current response as a function of a gate voltage and a drain-to-source voltage. The first on-current response is a scalar multiple of, i.e., is directly proportional to, another function of a gate voltage and a drain-to-source voltage of one of the first and second asymmetric pass gate transistors (2, 2') when the first source/drain region operates as a source and the second source/drain region operates as a drain. Specifically, the first and second asymmetric pass gate transistors (2, 2') has a forward mode on-current curve 610 as shown in FIG. 6, and the first pull-down NFET 4 and the second pull-down NFET 4' is directly proportional to the forward mode on-current curve 610 of the first and second asymmetric pass gate transistors (2, 2'). The scalar multiple may have a value from about 1.5 to about 2.5, although lesser and greater numbers are also contemplated herein. The value of the scalar multiple from about 1.5 to about 2.5 provides optimal cell stability for SRAM circuits. Preferably, all transistor characteristics including on-current, off-current, and threshold voltages are substantially matched between the first pull-down NFET 4 and the second pull-down NFET 4'. Also preferably, all transistor characteristics including on-current, off-current, and threshold voltages are substantially matched between the first pull-up PFET 6 and the second pull-up PFET 6'.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A static random access memory (SRAM) cell structure comprising:
   a pair of pull-up p-type field effect transistors (PFETs);
   a pair of pull-down n-type field effect transistors (NFETs), wherein each pull-down NFET comprises:
      a pull-down NFET drain region electrically connected to a pull-up PFET drain region of one of said pull-up PFETs;
      a pull-down NFET body region laterally adjacent said pull-down NFET drain region;
      a pull-down NFET halo region laterally adjacent said pull-down NFET body region and disjoined from said pull-down NFET drain region; and
      a pull-down NFET source region laterally adjacent said pull-down NFET halo region, wherein said pull-down NFET halo region and said pull-down NFET body region have a p-type doping, and wherein said pull-down NFET halo region has a higher dopant concentration than said pull-down NFET body region; and
   a pair of pass gate transistors, wherein each pass gate transistor is an n-type field effect transistor comprising a first source/drain region, a pass gate halo region abutting said first source/drain region, a body region abutting said pass gate halo region, and a second source/drain region abutting said body region and disjoined from said pass gate halo region, wherein said pass gate halo region and said body region have a p-type doping, wherein said pass gate halo region has a higher dopant concentration than said body region.

2. The SRAM cell of claim 1, wherein said pull-down NFET drain region laterally abuts a second source/drain region of one of said pair of pass gate transistors.

3. The SRAM cell of claim 1, wherein said pass gate halo region and said pull-down NFET halo region have substantially the same dopant concentration.

4. The SRAM cell of claim 1, wherein said body region and said pull-down NFET body region have substantially the same dopant concentration.

5. The SRAM cell of claim 1, wherein each of said pair of pull-up PFETs, said pair of pull-down NFETs, and said pair of pass gate transistors comprise a gate electrode comprising a stack of a first gate electrode portion vertically abutting a gate dielectric and a second gate electrode vertically abutting said first gate electrode portion.

6. The SRAM cell of claim 5, wherein said first gate electrode comprises a doped semiconductor material and said second gate electrode comprises a conductive material different from said doped semiconductor material.

7. The SRAM cell of claim 1, wherein each of said pair of pass gate transistors provides a greater on-current when said first source/drain region operates as a source and said second source/drain region operates as a drain than when said first source/drain region operates as a drain and said second source/drain region operates as a source.

8. A static random access memory (SRAM) circuit comprising:
   a pair of pull-up p-type field effect transistors (PFETs);
   a pair of pull-down n-type field effect transistors (NFETs), each pull-down NFET comprises a pull-down NFET drain directly connected to a pull-up PFET drain of one of said pull-up PFETs; and
   a pair of pass gate transistors, wherein each pass gate transistor is an n-type field effect transistor comprising a first source/drain terminal and a second source/drain terminal, wherein each of said pair of pass gate transistors provides a greater on-current when said first source/drain terminal operates as a source and said second source/drain terminal operates as a drain than when said first source/drain terminal operates as a drain and said second source/drain terminal operates as a source, wherein each of said air of pull-down NFETs has an on-current response as a function of a gate voltage and a drain-to-source voltage, wherein said on-current response is a scalar multiple of another function of a gate voltage and a drain-to-source voltage of one of said pass gate transistors when said first source/drain terminal operates as a source and said second source/drain terminal operates as a drain.

9. The SRAM circuit of claim 8, wherein said pull-down NFET drain is directly connected to a second source/drain terminal of one of said pair of pass gate transistors.

10. The SRAM circuit of claim 8, wherein said scalar multiple has a value from about 1.5 to about 2.5.

11. The SRAM circuit of claim 8, wherein all transistor characteristics are substantially matched between said pair of pull-up PFETs, wherein all transistor characteristics are substantially matched between said pair of pull-down NFETs, and wherein all transistor characteristics are substantially matched between said pair of pass gate transistors.

12. A static random access memory (SRAM) cell structure comprising:
   a pair of pull-up p-type field effect transistors (PFETs);
   a pair of pull-down n-type field effect transistors (NFETs), wherein each pull-down NFET comprises a pull-down NFET drain region electrically connected to a pull-up PFET drain region of one of said pull-up PFETs; and
   a pair of asymmetric pass gate transistors, wherein each of said asymmetric pass gate transistors is an n-type field effect transistor comprising a first source/drain region and a second source/drain region, and each of said pair of pull-down NFETs has an on-current response as a function of a gate voltage and a drain-to-source voltage, wherein said on-current response is a scalar multiple of another function of a gate voltage and a drain-to-source voltage of one of said asymmetric pass gate transistors when said first source/drain region operates as a source terminal and said second source/drain region operates as a drain terminal.

13. The SRAM cell of claim 12, wherein each of said asymmetric pass gate transistors has a halo implantation region directly on said first source/drain region, and said second source/drain region does not have any halo implantation region located directly thereupon.

14. The SRAM cell of claim 12, wherein each of said asymmetric pass gate transistors is an n-type field effect transistor comprising a pass gate halo region directly contacting said first source/drain region, a body region directly contacting said pass gate halo region, wherein second source/drain region contacts said body region and does not contact said pass gate halo region, said pass gate halo region and said body region have a p-type doping, and said pass gate halo region has a higher dopant concentration than said body region.

15. The SRAM cell of claim 12, wherein said scalar multiple has a value from about 1.5 to about 2.5.

16. The SRAM cell of claim 12, wherein all transistor characteristics are substantially matched between said pair of pull-up PFETs, wherein all transistor characteristics are substantially matched between said pair of pull-down NFETs, and wherein all transistor characteristics are substantially matched between said pair of asymmetric pass gate transistors.

* * * * *